US010745819B2

(12) United States Patent
Furutani et al.

(10) Patent No.: US 10,745,819 B2
(45) Date of Patent: *Aug. 18, 2020

(54) PRINTED WIRING BOARD, SEMICONDUCTOR PACKAGE AND METHOD FOR MANUFACTURING PRINTED WIRING BOARD

(71) Applicant: IBIDEN CO., LTD., Ogaki-shi (JP)

(72) Inventors: Toshiki Furutani, Ogaki (JP); Yuki Yoshikawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/958,332

(22) Filed: Apr. 20, 2018

(65) Prior Publication Data

US 2018/0237934 A1    Aug. 23, 2018

Related U.S. Application Data

(63) Continuation of application No. 14/700,313, filed on Apr. 30, 2015, now Pat. No. 9,951,434.

(30) Foreign Application Priority Data

Apr. 30, 2014    (JP) ................. 2014-093815

(51) Int. Cl.
*H05K 3/46*    (2006.01)
*H05K 3/18*    (2006.01)
(Continued)

(52) U.S. Cl.
CPC ............ *C25D 5/48* (2013.01); *C23C 18/1653* (2013.01); *C25D 5/022* (2013.01); *C25D 7/00* (2013.01);
(Continued)

(58) Field of Classification Search
CPC ............ H05K 3/34632; H05K 3/4682; H05K 3/4617; H05K 3/188; H05K 1/0271; H05K 1/0298; H05K 1/115; H05K 1/0366
See application file for complete search history.

(56) References Cited

U.S. PATENT DOCUMENTS 6,828,510 B1    12/2004 Asai et al.
7,307,852 B2    12/2007 Inagaki et al.
(Continued)

FOREIGN PATENT DOCUMENTS

JP    2000-349435 A    12/2000

*Primary Examiner* — Nathan Milakovich
(74) *Attorney, Agent, or Firm* — Oblon, McClelland, Maier & Neustadt, L.L.P.

(57) ABSTRACT

A printed wiring board includes a core laminate including insulating layers and conductor layers, a first build-up layer formed on first surface of the laminate and including first interlayer resin and conductor layers, and a second build-up layer formed on second surface of the core laminate on the opposite side and including second interlayer resin and conductor layers. The conductor layers in the laminate include first and second conductor layers such that the first conductor layer is embedded in one of the insulating layers forming the first surface of the laminate and has an exposed surface exposed from the insulating layer and that the second conductor layer is formed on one of the insulating layers forming the second surface of the laminate, and the first interlayer resin layer has thickness greater than thickness of the second interlayer resin layer.

20 Claims, 9 Drawing Sheets

(51) Int. Cl.
- *H05K 1/11* (2006.01)
- *H05K 1/02* (2006.01)
- *C25D 7/12* (2006.01)
- *C25D 5/02* (2006.01)
- *C23C 18/16* (2006.01)
- *C25D 5/48* (2006.01)
- *H05K 1/03* (2006.01)
- *C25D 7/00* (2006.01)

(52) U.S. Cl.
CPC ........... *C25D 7/123* (2013.01); *H05K 1/0271* (2013.01); *H05K 1/0298* (2013.01); *H05K 1/0366* (2013.01); *H05K 1/115* (2013.01); *H05K 3/188* (2013.01); *H05K 3/4617* (2013.01); *H05K 3/4632* (2013.01); *H05K 3/4682* (2013.01); *H01L 2224/16225* (2013.01); *H01L 2224/48091* (2013.01); *H01L 2224/48227* (2013.01); *H05K 2201/0195* (2013.01); *H05K 2203/0723* (2013.01)

(56) References Cited

U.S. PATENT DOCUMENTS

| | | | |
|---|---|---|---|
| 7,989,707 | B2 | 8/2011 | Yamano et al. |
| 8,110,749 | B2 | 2/2012 | Yoshimura et al. |
| 9,601,422 | B2 * | 3/2017 | Furutani ........... H01L 23/49822 |
| 9,951,434 | B2 * | 4/2018 | Furutani ............... H05K 3/4632 |
| 10,098,243 | B2 * | 10/2018 | Furutani ............... H05K 3/4673 |
| 2006/0154496 | A1 | 7/2006 | Imamura et al. |
| 2008/0277150 | A1 | 11/2008 | Takashima et al. |
| 2011/0215464 | A1 | 9/2011 | Guzek et al. |
| 2013/0192884 | A1 | 8/2013 | Furutani et al. |
| 2014/0014399 | A1 | 1/2014 | Kariya et al. |
| 2014/0262447 | A1 | 9/2014 | Katsuda et al. |
| 2014/0290997 | A1 | 10/2014 | Maeda |
| 2015/0016079 | A1 | 1/2015 | Furutani et al. |
| 2015/0179616 | A1 | 6/2015 | Lin et al. |
| 2016/0088727 | A1 | 3/2016 | Furutani et al. |
| 2016/0316566 | A1 | 10/2016 | Sakai et al. |

* cited by examiner

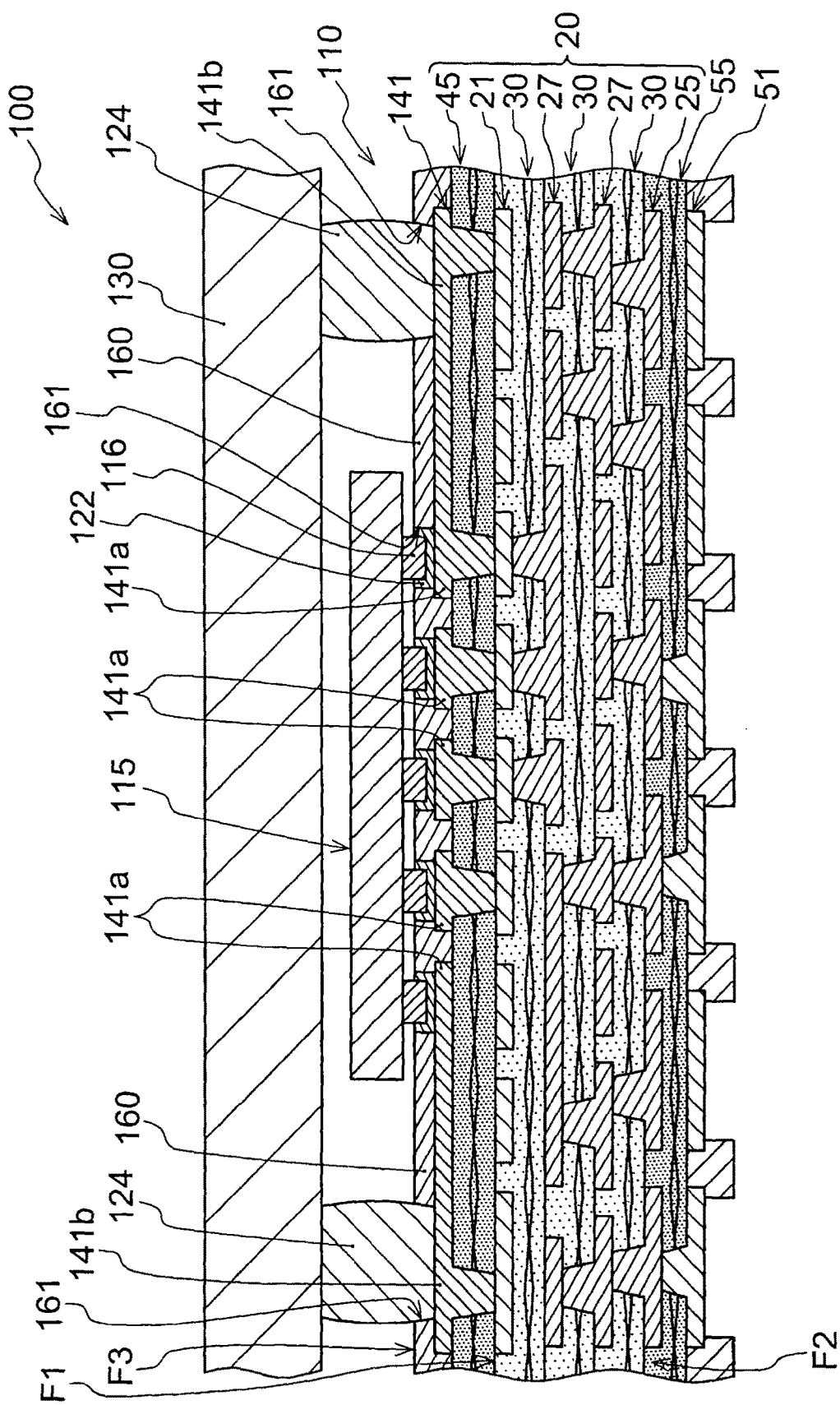

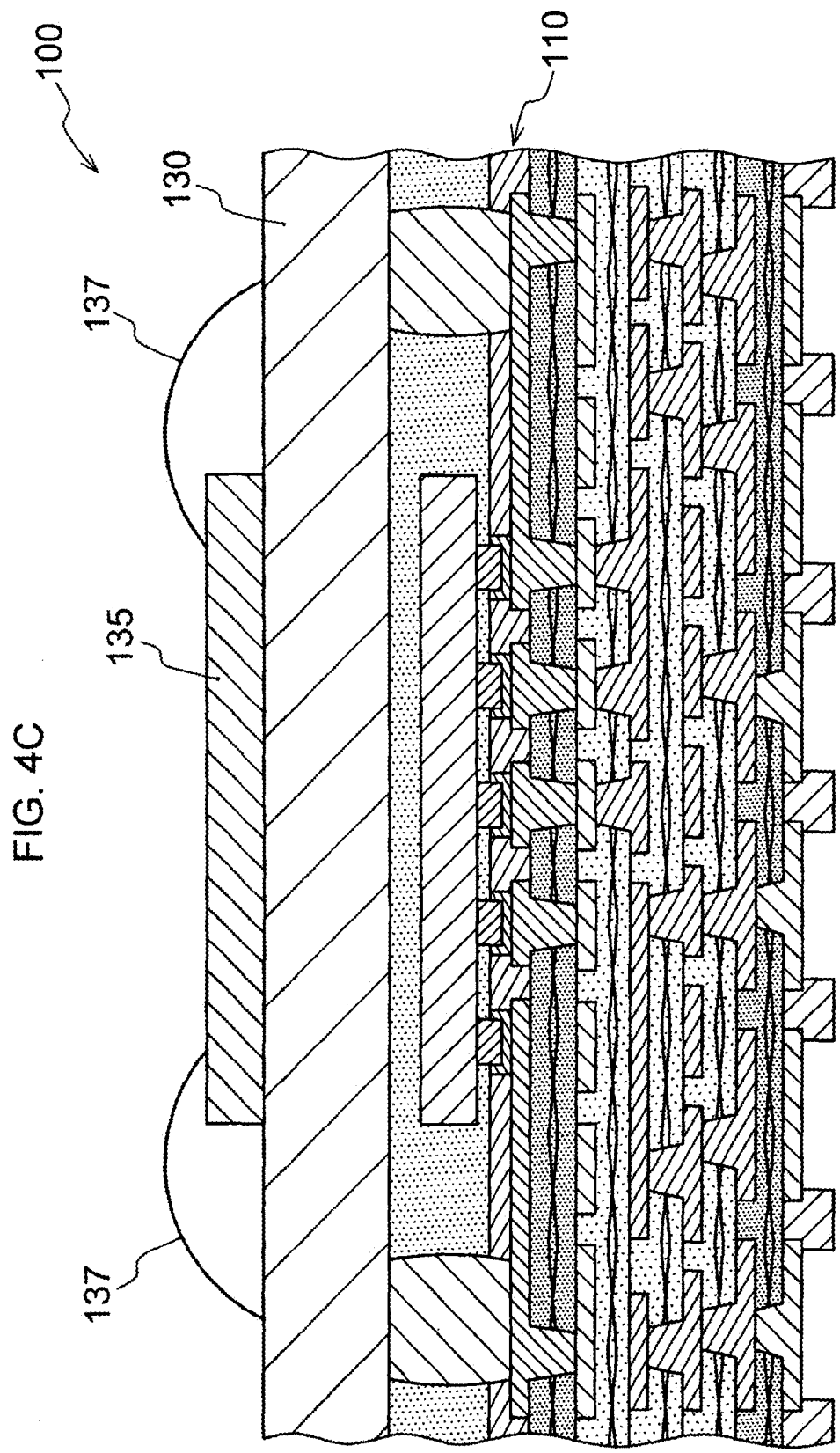

PRINTED WIRING BOARD, SEMICONDUCTOR PACKAGE AND METHOD FOR MANUFACTURING PRINTED WIRING BOARD

CROSS-REFERENCE TO RELATED APPLICATIONS

The present application is a continuation of and claims the benefit of priority to U.S. patent application Ser. No. 14/700,313, filed Apr. 30, 2015, which is based upon and claims the benefit of priority to Japanese Patent Application No. 2014-093815, filed Apr. 30, 2014. The entire contents of these applications are incorporated herein by reference

BACKGROUND OF THE INVENTION

Field of the Invention

The present invention relates to a printed wiring board and a semiconductor package and to a method for manufacturing the printed wiring board. In particular, the present invention relates to a printed wiring board for which a warpage is small and that has a flat surface and allows an electronic component such as a semiconductor element to be mounted with a good yield.

Description of Background Art

For example, Japanese Patent Laid-Open Publication No. 2000-349435 describes a printed wiring board. The entire contents of this publication are incorporated herein by reference.

SUMMARY OF THE INVENTION

According to one aspect of the present invention, a printed wiring board includes a core laminate including insulating layers and conductor layers, a first build-up layer formed on a first surface of the core laminate and including a first interlayer resin insulating layer and a conductor layer laminated on the first interlayer resin insulating layer, and a second build-up layer formed on a second surface of the core laminate on the opposite side with respect to the first surface of the core laminate and including a second interlayer resin insulating layer and a conductor layer laminated on the second interlayer resin insulating layer. The conductor layers in the core laminate include a first conductor layer and a second conductor layer such that the first conductor layer is embedded in one of the insulating layers forming the first surface of the core laminate and has an exposed surface exposed from the insulating layer and that the second conductor layer is formed on one of the insulating layers forming the second surface of the core laminate, and the first interlayer resin insulating layer has a thickness which is greater than a thickness of the second interlayer resin insulating layer.

According to another aspect of the present invention, a semiconductor package includes a printed wiring board, a semiconductor component mounted on a surface of the printed wiring board, and a substrate mounted on the surface of the printed wiring board. The printed wiring board includes a core laminate including insulating layers and conductor layers, a first build-up layer formed on a first surface of the core laminate and including a first interlayer resin insulating layer and a conductor layer laminated on the first interlayer resin insulating layer, a second build-up layer formed on a second surface of the core laminate on the opposite side with respect to the first surface of the core laminate and including a second interlayer resin insulating layer and a conductor layer laminated on the second interlayer resin insulating layer, and a solder resist layer formed on the conductor layer of the first build-up layer such that the solder resist layer has opening portion exposing portions of the conductor layer, respectively, the conductor layers in the core laminate include a first conductor layer and a second conductor layer such that the first conductor layer is embedded in one of the insulating layers forming the first surface of the core laminate and has an exposed surface exposed from the insulating layer and that the second conductor layer is formed on one of the insulating layers forming the second surface of the core laminate, the first interlayer resin insulating layer has a thickness which is greater than a thickness of the second interlayer resin insulating layer, and the substrate has bumps such that the bumps are connected to the portions of conductor layer exposed from the solder resist layer, respectively.

According to yet another aspect of the present invention, a method for manufacturing a printed wiring board includes forming on a support plate a core laminate including insulating layers and conductor layers, removing the support plate from the core laminate such that the support plate is separated from one of the conductor layers on a first surface of the core laminate, forming a first interlayer resin insulating layer on the one of the conductor layers on the first surface of the core laminate, and forming a second interlayer resin insulating layer on a second surface of the core laminate on the opposite side with respect to the first surface of the core laminate. The forming of the core laminate includes forming the conductor layers including a first conductor layer and a second conductor layer such that the first conductor layer is embedded in one of the insulating layers forming the first surface of the core laminate and has an exposed surface exposed from the insulating layer and that the second conductor layer is formed on one of the insulating layers forming the second surface of the core laminate, and the first interlayer resin insulating layer has a thickness which is different from a thickness of the second interlayer resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A is a cross-sectional view of an example of a semiconductor package of an embodiment of the present invention;

FIG. 4C is a cross-sectional view of yet another example of a semiconductor package of an embodiment of the present invention.

DETAILED DESCRIPTION OF THE EMBODIMENTS

Figure 1:
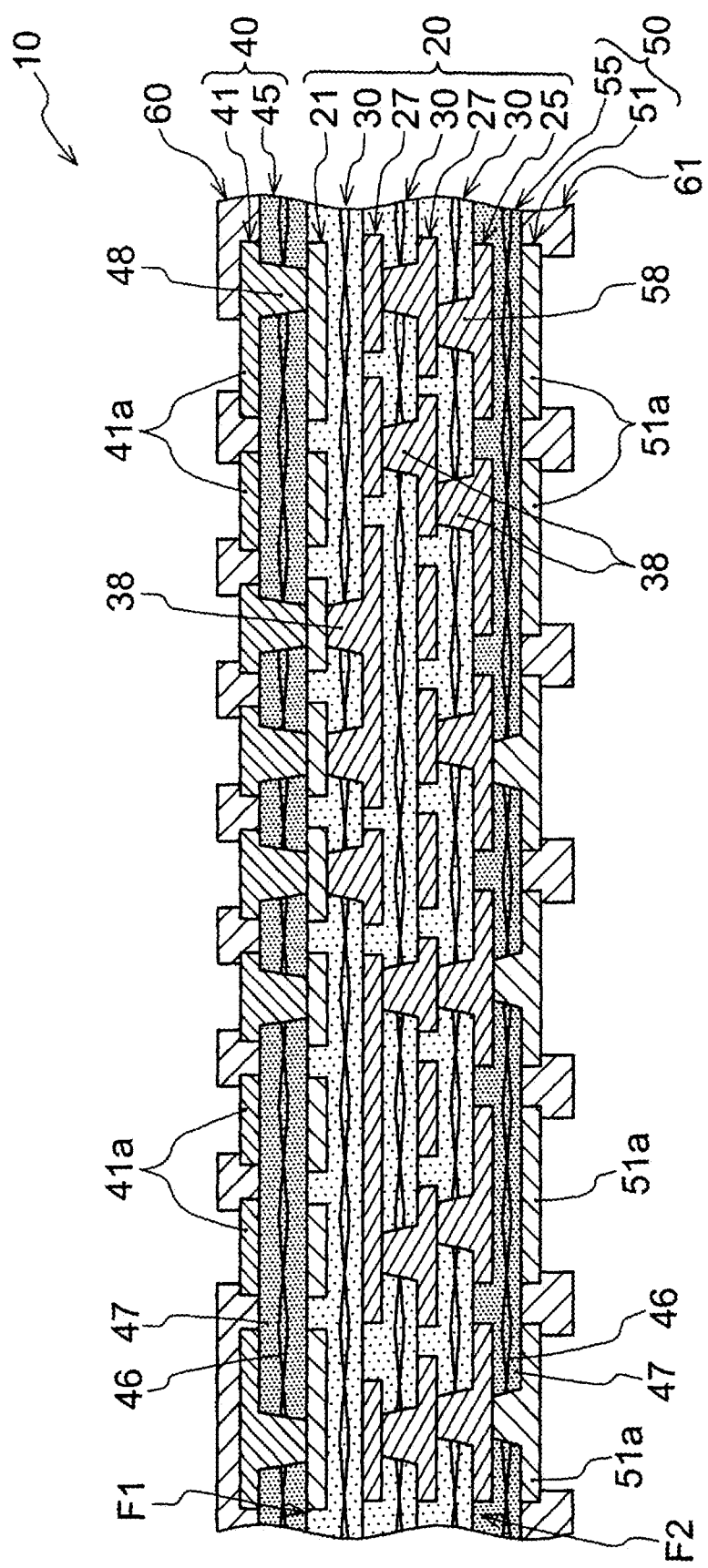
FIG. 1 is a cross-sectional view of a printed wiring board according to an embodiment of the present invention.

The embodiments will now be described with reference to the accompanying drawings, wherein like reference numerals designate corresponding or identical elements throughout the various drawings.

Figure 2:
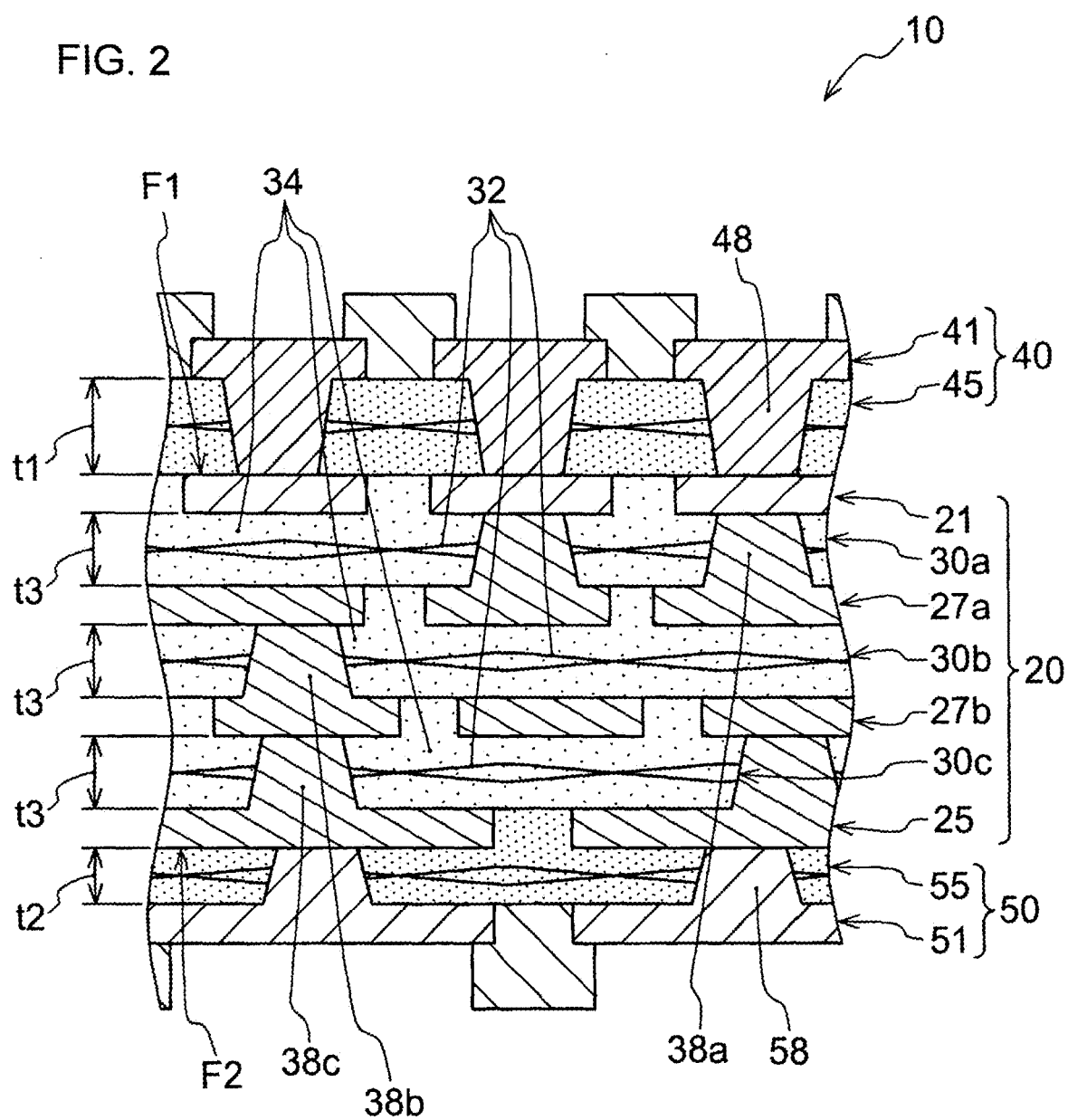
FIG. 2 is an enlarged view of a central portion of the wiring board illustrated in FIG. 1.

As illustrated in FIG. 1, a printed wiring board 10 (hereinafter, the printed wiring board is also simply referred to as a wiring board) of an embodiment of the present invention includes: a core laminate 20 that has a first conductor layer 21 on a first surface (F1) and a second conductor layer 25 on a second surface (F2) that is on an opposite side of the first surface (F1); a first build-up layer 40 that is provided on the first surface (F1) of the core laminate 20 and includes a first interlayer resin insulating layer 45 and a third conductor layer 41 that is laminated on the first interlayer resin insulating layer 45; and a second build-up layer 50 that is provided on the second surface (F2) of the core laminate 20 and includes a second interlayer resin insulating layer 55 and a fourth conductor layer 51 that is laminated on the second interlayer resin insulating layer 55. As illustrated in FIG. 2, the wiring board 10 of the present embodiment is characterized in that the second conductor layer 25 is formed on an insulating layer (30c) of the second surface (F2) of the core laminate 20, whereas the first conductor layer 21 is embedded in an insulating layer (30a) of the first surface (F1) of the core laminate 20 while one surface of the first conductor layer 21 on the first build-up layer 40 side is exposed from the insulating layer (30a). Therefore, as illustrated in FIG. 1, the first surface (F1) of the core laminate 20 is a substantially flat surface, and the first interlayer resin insulating layer 45 is thicker than the second interlayer resin insulating layer 55. In the following description, when a positional relation in a thickness direction of the wiring board 10 is indicated, unless otherwise indicated, a farther side from a central portion of the core laminate 20 (from an insulating layer (30b) in the example illustrated in FIG. 2) is referred to as an "upper side" or an "outer side" and a closer side is referred to as a "lower side" or an "inner side." Further, according to this definition, a surface positioned on an "upper side" is referred to as an "upper surface" and a surface positioned on a "lower side" is referred to as a "lower surface."

In general, an interlayer resin insulating layer that is laminated on a build-up layer of a build-up wiring board is formed to have a thickness of about 20-100 μm so that a suitable rigidity can be maintained while satisfying demand for thinning of the wiring board. On the other hand, a conductor layer such as the first conductor layer 21 is formed to have a thickness of at least about 5-30 μm in order to have a predetermined conductivity. Therefore, when a conductor layer, such as the first conductor layer 21, of a surface layer part of a core laminate (core substrate) is formed on an insulating layer of the surface layer part, it is possible that a level difference due to the thickness of the conductor layer is not absorbed in the build-up layer and appears on a surface of the build-up layer. As a result, unevenness may occur in the surface of the printed wiring board. It is presumable that the tendency for such unevenness to occur is further enhanced when an interlayer resin insulating layer that is laminated on a build-up layer is thinned in accordance with the rising demand for the thinning of a wiring board. When unevenness exists on a surface of a wiring board, it is possible that connection pads on the surface of the wiring board cannot be in contact with all electrodes of an electronic component or the like that is mounted on the wiring board. As a result, a yield of mounting the electronic component to the wiring board may be reduced. It is presumable that such tendency becomes significant along with increases in size and in the number of pins (electrodes) of a semiconductor element or the like as the semiconductor element or the like becomes more sophisticated.

However, in the wiring board 10 of the present embodiment, as illustrated in FIG. 2, the first conductor layer 21 that is formed in a surface layer part on the first surface (F1) side of the core laminate 20 is embedded in the insulating layer (30a) by having only one surface thereof exposed. Therefore, the first surface (F1) of the core laminate 20 is a substantially flat surface as illustrated in FIG. 1, and unevenness of the surface of the wiring board 10 on the first surface (F1) side can be suppressed. Therefore, a situation where not all electrodes 91 (see FIG. 3J) of an electronic component such as a semiconductor element 90 (see FIG. 3J) can be in contact with connection pads (41a) that are formed on the surface of the wiring board 10 on the first surface (F1) side of the core laminate 20 is unlikely to occur. As a result, reduction in the yield of mounting the electronic component to the wiring board 10 is prevented. For example, when a large semiconductor element or the like having a large number of pins is mounted, it is preferable that the semiconductor element or the like be mounted on the surface of the wiring board 10 on the first surface (F1) side, that is, on the third conductor layer 41 in the present embodiment. By doing so, occurrence of contact failure can be suppressed and the semiconductor element 90 or the like can be mounted with a good yield.

Further, as described above, when an electronic component such as a large semiconductor element is mounted on only one side of the wiring board, in general, since a thermal expansion coefficient of the semiconductor element or the like is larger than a thermal expansion coefficient of an insulating layer that is used in the wiring board, warpage in which the side on which the semiconductor element is mounted becomes concave when temperature is high and becomes convex when the temperature is low is likely to occur in the wiring board. Further, the occurrence of the warpage is also facilitated by that, when a large component is mounted on only one side of the wiring board, an area of a solder resist that is formed on this one side is likely to become smaller as compared to the other side of the wiring board and, as a result, an amount of expansion and contraction of this one side due to a change in temperature is smaller than the other side. When the printed wiring board warps, a stress occurs in a connecting portion of each electronic component mounted on the printed wiring board. Therefore, connection reliability of the electronic component may be reduced.

However, in the wiring board 10 of the present embodiment, as illustrated in FIG. 2, a thickness (t1) of the first interlayer resin insulating layer 45 that is laminated on the first surface (F1) of the core laminate 20 is thicker than a thickness (t2) of the second interlayer resin insulating layer 55 that is laminated on the second surface (F2). Therefore, an amount of expansion and contraction due to a change in temperature is larger for the first interlayer resin insulating layer 45 than it is for the second interlayer resin insulating layer 55. That is, the first surface (F1) side of the core laminate 20 expands more than the second surface (F2) side when temperature is high and contracts more than the second surface (F2) side when temperature is low. Therefore, an action is obtained in a direction opposite to the above-described action due to the difference between the thermal expansion coefficients of the semiconductor element and the material of the wiring board and due to the difference in the areas of the solder resists on the one side and on the other side of the wiring board. As a result, the warpage of the wiring board 10 is reduced, and reduction in the connection reliability of the electronic component (not illustrated in the drawings) that is mounted on the wiring board 10 can be prevented. Therefore, as described above, even when a large semiconductor element or the like is mounted only on the first surface (F1) of the core laminate 20 and such a semiconductor element or the like is not mounted on the second surface (F2) side, the warpage of the wiring board 10 is suppressed and reduction in the connection reliability of the electronic component is prevented.

As illustrated in FIG. 2, in the present embodiment, the core laminate 20 has a structured in which the first conductor layer 21, the insulating layer (30a), an inner-layer conductor layer (27a), the insulating layer (30b), an inner-layer conductor layer (27b), the insulating layer (30c) and the second conductor layer 25 are sequentially laminated, and is formed by alternately laminating the conductor layers that form wiring patterns or the like and the insulating layers that insulate between the conductor layers. Depending on a scale, a wiring density and the like of circuit wiring that is formed in the wiring board 10, the core laminate 20 may be formed by four or more insulating layers and five or more conductor layers, or may be formed by two or less insulating layers and three or less conductor layers.

As illustrated in FIG. 2, in the present embodiment, the insulating layers (30a, 30b, 30c) (hereinafter, the insulating layers (30a, 30b, 30c) may be collectively referred as the insulating layers 30 when individual specification is not required) each include a core material 32 and a resin material 34 made of a resin composition. As will be described later, the insulating layers 30 may each be formed from a prepreg material in a semi-cured state obtained by impregnating the core material 32 with the resin material 34. The core material 32 is not particularly limited. Preferably, inorganic fiber such as glass fiber with superior insulation performance and rigidity can be used as the core material 32. The resin material 34 is also not particularly limited as long as the resin material 34 has pressure resistance and insulation performance required for the wiring board 10. For example, as the resin material 34, epoxy resin or bismaleimide triazine resin (BT resin) can be used, and preferably epoxy resin can be used. Further, the resin material 34 may be filled with an inorganic filler made of silica, alumina or the like. However, the materials from which the insulating layers 30 are formed are arbitrary. Materials different from the above-described materials may also be used as the core material 32 and the resin material 34. Further, the insulating layers 30 may also be formed of only the resin material 34 without including the core material 32.

As illustrated in FIG. 2, the first conductor layer 21 is embedded in the insulating layer (30a) such that only one surface of the first conductor layer 21 on the first build-up layer 40 side is exposed from the insulating layer (30a). In this way, due to the structure in which the first conductor layer 21 is embedded in the insulating layer (30a), in addition to that the first surface (F1) of the core laminate 20 is a substantially flat surface as described above, adhesion between the first conductor layer 21 and the insulating layer (30a) is enhanced. Therefore, even when a wiring pattern (not illustrated in the drawings) with a narrow width is formed in the first conductor layer 21, the wiring pattern is unlikely to be peeled off from the insulating layer (30a). Further, since the insulating layer (30a) is interposed between adjacent wiring patterns, even when the wiring patterns are parallel-aligned at a narrow pitch, short circuit between the wiring patterns via solders connecting an electronic component (not illustrated in the drawings) is unlikely to occur. A method for forming the first conductor layer 21 is not particularly limited. However, as will be described later, an electroplating method that allows a thick film to be formed in a short time period is preferably used. A material of the first conductor layer 21 is not particularly limited. However, copper is used that has high conductivity, is inexpensive and also has good deposition properties in the above-described electroplating method.

As illustrated in FIG. 2, the second conductor layer 25 is formed on the insulating layer (30c). Further, the inner-layer conductor layer (27a) and the inner-layer conductor layer (27b) are respectively formed on surfaces of the insulating layer (30a) and the insulating layer (30b) on the second surface (F2) side of the core laminate 20. Methods for forming the second conductor layer 25 and the inner-layer conductor layers (27a, 27b) (hereinafter, the inner-layer conductor layers (27a, 27b) may be collectively referred to as the inner-layer conductor layers 27 when individual specification is not required) are not particularly limited. For example, as will be described later, the inner-layer conductor layer (27a) may be formed by laminating a metal foil 271 (made of copper, for example) (see FIG. 3C) on a surface of the insulating layer (30a) and depositing a first metal film 272 (see FIG. 3D) by electroless plating and a second metal film 273 (see FIG. 3E) by electroplating on a surface of the metal foil 271. The second conductor layer 25 and the inner-layer conductor layer (27b) may also be similarly formed. In this case, the second conductor layer 25 and the inner-layer conductor layers 27 are each formed by three layers including a metal foil, an electroless plating film and an electroplating film. However, without being limited to such a three-layer structure, the second conductor layer 25 and the inner-layer conductor layers 27 may each also be formed by, for example, an electroplating film only. Materials of the second conductor layer 25 and the inner-layer conductor layers 27 are also not particularly limited, and any conductive material, preferably a metal material such as copper or nickel, can be used. However, for the same reason as for the above-described first conductor layer 21, copper is particularly preferably used for all of the metal foil, the electroless plating film and the electroplating film.

As illustrated in FIG. 2, the first interlayer resin insulating layer 45 that forms the first build-up layer 40 is laminated on the first conductor layer 21 and on a portion of the insulating layer (30a) where the first conductor layer 21 is not embedded. Further, the second interlayer resin insulating layer 55 that forms the second build-up layer 50 is laminated on the second conductor layer 25 and on a portion of the insulating layer (30c) that is not covered by the second conductor layer 25. Further, as described above, the thickness (t1) of the first interlayer resin insulating layer 45 (a length between an upper surface of the first conductor layer 21 and a lower surface of the third conductor layer 41) is thicker than the thickness (t2) of the second interlayer resin insulating layer 55 (a length between an upper surface of the second conductor layer 25 and a lower surface of the fourth conductor layer 51). Further, as illustrated in FIG. 2, the thickness (t1) of the first interlayer resin insulating layer 45 may also be thicker than a thickness (t3) of each of the insulating layers (30a, 30b, 30c) in the core laminate 20 (for example, for the insulating layer (30a), a length between an upper surface of the inner-layer conductor layer (27a) and a lower surface of the first conductor layer 21). By doing so, the above-described effect of suppressing the warpage of the wiring board 10 can be further enhanced.

Similar to the above-described materials of the insulating layers 30, materials of the first and second interlayer resin insulating layers (45, 55) are not particularly limited. Therefore, as illustrated in FIG. 1, the first and second interlayer resin insulating layers (45, 55) may each include a core material 46 and a resin material 47 made of a resin composition. Further, the first and second interlayer resin insulating layers (45, 55) may also each be formed from a prepreg material in a semi-cured state obtained by impregnating the core material 46 with the resin material 47. Glass fiber or the like with superior insulation performance and rigidity is preferably used for the core material 46, and epoxy resin is preferably used for the resin material 47. Further, it is also possible that the first and second interlayer resin insulating layers (45, 55) are each formed without the core material 46, that is, are each formed of only the resin material 47 that does not impregnate the core material 46. When the first and second interlayer resin insulating layers (45, 55) are each formed of only the resin material 47, adhesion of an electroless plating film to a surface thereof may be improved. Therefore, as will be described later in the method for manufacturing the wiring board 10, it is possible that the third and fourth conductor layers (41, 51) can be formed without requiring a metal foil (not illustrated in the drawings) laminated together with the first and second interlayer resin insulating layers (45, 55). Further, regardless of whether or not the core material 46 is impregnated with the resin material 47, the resin material 47 may be filled with an inorganic filler (not illustrated in the drawings) or the like made of silica or alumina. In this case, making the content of the inorganic filler 30-70 wt % with respect to the entire first interlayer resin insulating layer 45 or second interlayer resin insulating layer 55 is preferable in that the adhesion to the third and fourth conductor layers (41, 51) is maintained while the thermal expansion coefficient of the first and second interlayer resin insulating layers and the thermal expansion coefficient of an electronic component (not illustrated in the drawings) that is mounted to the wiring board 10 are close to each other. However, the material for forming the first and second interlayer resin insulating layers (45, 55) is arbitrary. A material different from the above-described material may also be used.

As illustrated in FIG. 1, the third conductor layer 41 is formed on the surface of the wiring board 10 on the first surface (F1) side of the core laminate 20. The fourth conductor layer 51 is formed on the surface of the wiring board 10 on the second surface (F2) side. In the third conductor layer 41, the connection pads (41a) that connect to, for example, the electrodes 91 (see FIG. 3J) of the semiconductor element 90 (see FIG. 3J) may be formed, and further, connection pads that connect to another electronic component (not illustrated in the drawings) may also be formed. Further, also in the fourth conductor layer 51, an arbitrary conductor pattern including connection pads (51a) and the like may be formed for connecting to an electronic component (not illustrated in the drawings) or to an external wiring board on which the wiring board 10 is mounted. The first conductor layer 21 that is embedded in the insulating layers 30 is not directly used as a connection layer for connecting to the semiconductor element 90 or the like. As described above, the first build-up layer 40 is provided and the third conductor layer that is formed in the first build-up layer is used as the connection layer. Thereby, a gap (stand-off) of a thickness of the third conductor layer 41 is ensured between the wiring board 10 and the semiconductor element 90 or the like. Therefore, stresses occurring in connecting portions between the wiring board 10 and the semiconductor element 90 or the like due to ambient temperature variation and the like are reduced, and the connection reliability of the semiconductor element 90 or the like is improved.

A method for forming the third and fourth conductor layers (41, 51) is not particularly limited. However, for example, the third and fourth conductor layers (41, 51) are formed using the same method as that for the second conductor layer 25 and the inner-layer conductor layer 27 described above. That is, the third and fourth conductor layers (41, 51) may be formed by laminating, for example, a metal foil (not illustrated in the drawings) made of copper on the first and second interlayer resin insulating layers (45, 55) and depositing an electroless plating film (not illustrated in the drawings) and an electroplating film (not illustrated in the drawings) on the metal foil. However, without being limited to such a structure, the third and fourth conductor layers (41, 51) may each also be formed by, for example, an electroplating film only. Materials of the third and fourth conductor layers (41, 51) are not particularly limited. Similar to the second conductor layer 25 and the inner-layer conductor layers 27 described above, metal materials such as copper and nickel are preferably used, and copper is particularly preferably used for all of the metal foil, the electroless plating film and the electroplating film.

As illustrated in FIG. 2, via conductors (38a), via conductors (38b) and via conductors (38c) that penetrate through the insulating layers 30 of the core laminate 20 are formed in the wiring board 10. The via conductors (38a) that penetrate through the insulating layer (30a) connect the first conductor layer 21 and the inner-layer conductor layer (27a). The via conductors (38b) that penetrate through the insulating layer (30b) connect the inner-layer conductor layer (27a) and the inner-layer conductor layer (27b). The via conductors (38c) that penetrate through the insulating layer (30c) connect the inner-layer conductor layer (27b) and the second conductor layer 25. Further, in the wiring board 10, as illustrated in FIG. 1, via conductors 48 that penetrate through the first interlayer resin insulating layer 45 and connect the third conductor layer 41 and the first conductor layer 21 are formed, and similarly, via conductors 58 that penetrate through the second interlayer resin insulating layer 55 and connect the fourth conductor layer 51 and the second conductor layer 25 are formed.

Methods for forming the via conductors (38a, 38b, 38c) (hereinafter, the via conductors (38a, 38b, 38c) may be collectively referred to as the via conductors 38 when individual specification is not required) and the via conductors (48, 58) are not particularly limited. For example, as will be described later, the via conductors (38a) may be formed by embedding the first metal film 272 (see FIG. 3D) formed by electroless plating and the second metal film 273 (see FIG. 3E) formed by electroplating in through holes 39 (see FIG. 3D) that are formed by penetrating the insulating layer (30a) by, for example, irradiating $CO_2$ laser. The via conductors (38b, 38c), the via conductors 48 and the via conductors 58 may also be respectively formed using the same method in the insulating layers (30b, 30c) and the first and second interlayer resin insulating layers (45, 55). In an example illustrated in FIG. 3E, the through holes 39 in which the via conductors (38a) are forming are completely filled with the second metal film 273. However, without being limited to this, it is also possible that the through holes 39 are not completely filled. The same applies also to the via conductors (38b, 38c) and the via conductors (48, 58). Materials of the via conductors (38, 48, 58) are not particularly limited. However, copper is preferably used that has high conductivity, is inexpensive and also has good deposition properties in plating.

In the present embodiment, as illustrated in FIG. 1, the via conductors 48 are each formed in a shape of which a cross section in a plane perpendicular to a thickness direction of the wiring board 10 (hereinafter, the cross section in such a plane is simply referred to as a horizontal cross section) is smaller on the first conductor layer 21 side than on the third conductor layer 41 side. On the other hand, the via conductors 58 are each formed in a shape of which a horizontal cross section is smaller on the second conductor layer 25 side than on the fourth conductor layer 51 side. The via conductors 38 are each formed in a shape of which a horizontal cross section is smaller on the first surface (F1) side than on the second surface (F2) side of the core laminate 20. That is, the via conductors 48, the via conductors 58 and the via conductors 38 are formed in such a manner that the horizontal cross sections of the via conductors 48 expand or shrink in a direction opposite to a direction in which the horizontal cross sections of the via conductors 58 and the via conductors 38 expand or shrink. As will be described later, when the through holes 39 (see FIG. 3D) and the like are formed by irradiating, for example, $CO_2$ laser or the like to the insulating layer 30 from the second surface (F2) side of the core laminate 20 and through holes (not illustrated in the drawings) of the via conductors 48, 58 are respectively formed by respectively irradiating $CO_2$ laser or the like to the first and second interlayer resin insulating layers (45, 55) from the sides of the third and fourth conductor layers (41, 51), the via conductors (38, 48, 58) are likely to be formed in the shapes of which the horizontal cross sections respectively expand (shrink) in the directions as illustrated in FIG. 1.

In the present embodiment, as illustrated in FIG. 1, a solder resist layer 60 is for red on the first interlayer resin insulating layer 45 and on a portion of the third conductor layer 41 excluding the connection pads (41a) to which the semiconductor element 90 (see FIG. 3J) is connected. Further, a solder resist layer 61 is formed on the second interlayer resin insulating layer 55 and on a portion of the fourth conductor layer 51 excluding the connection pads (51a). The portions where the solder resist layers (60, 61) are formed are not limited to these. Depending on the type and number of electronic components (not illustrated in the drawings) mounted on the wiring board 10, the solder resist layers (60, 61) may be provided on any portions of the third and fourth conductor layers (41, 51). Further, any portions of the conductor layers (41, 51) may be exposed without being covered by the solder resist layers (60, 61).

A material of the solder resist layers (60, 61) is not particularly limited as long as the material has good solder dip resistance and insulation performance. However, for example, the solder resist layers (60, 61) are formed using epoxy resin, acrylic resin or the like, and preferably, are formed using a material made of epoxy resin containing 40-70 wt % of an inorganic filler such as $SiO_2$.

Further, a corrosion-resistant layer or solder coating layer (not illustrated in the drawings), made of, for example, Ni/Au, Ni/Pd/Au, Sn or an organic protective film (OSP), may be formed on exposed portions of the third and fourth conductor layers (41, 51) where the solder resist layers (60, 61) are not formed, such as the connection pads (41a, 51a).

Next, a method for manufacturing the wiring board 10 of the present embodiment is described with reference to FIG. 3A-3J.

Figure 3A:
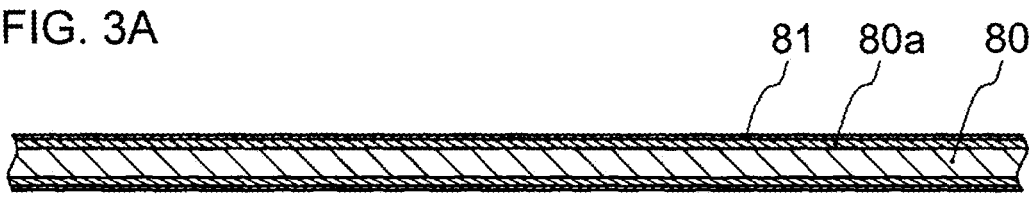
FIG. 3A is an explanatory diagram of a process of a method for manufacturing the printed wiring board illustrated in FIG. 1.

In the method for manufacturing the wiring board 10 of the present embodiment, first, the core laminate 20 (see FIG. 1) is manufactured. First, as illustrated in FIG. 3A, as starting materials, a support plate 80, a support copper foil (80a) and a base metal foil 81 are prepared. The carrier copper foil (80a) is laminated on both sides of the support plate 80 and is bonded to both sides of the support plate 80 by applying heat and pressure. A prepreg material or the like in a semi-cured state made of a material obtained by impregnating a core material such as a glass cloth with insulating resin such as epoxy is preferably used for the support plate 80. However, without being limited to this, other materials may also be used. A material of the base metal foil 81 is not particularly limited as long as the first conductor layer 21 (see FIG. 3B) (to be described later) can be formed on a surface of the material. However, a copper foil or a nickel foil having a thickness of 2-6 μm is preferably used, and a copper foil having a thickness of 5 μm is more preferably used. Further, for example, a copper foil having a thickness of 15-30 μm, preferably 18 μm, is used for the carrier copper foil (80a). However, the base metal foil 81 and the carrier copper foil (80a) are not limited to have these thicknesses, but may also have other thicknesses.

A method for bonding the carrier copper foil (80a) and the base metal foil 81 is not particularly limited. However, for example, substantially entire sticking surfaces of the two may be boned by a thermoplastic adhesive (not illustrated in the drawings), or, the two may be bonded by an adhesive, or by ultrasonic connection, in a margin portion in a vicinity of an outer periphery where a conductor pattern of the first conductor layer 21 (see FIG. 3B) (to be described later) is not provided. Further, the carrier copper foil (80a) and the base metal foil 81 may be bonded to each other before the carrier copper foil (80a) is bonded to the support plate 80. However, without being limited to this, for example, it is also possible that a double-sided copper-clad laminated plate is used for the support plate 80; a copper foil that is already bonded to both sides of the double-sided copper-clad laminated plate is used as the carrier copper foil (80a); and the single base metal foil 81 is bonded to the copper foil using the above-described method or the like.

In FIG. 3A-3F, an example of an manufacturing method is illustrated in which the base metal foil 81 is bonded to surfaces on both sides of the support plate 80 and the core laminate 20 is formed on each of the surfaces. This is preferable in that, when the wiring board 10 is formed on each of both sides of the support plate 80, two core laminates 20 are manufactured at once. However, it is also possible that the core laminate 20 is formed on only one side of the support plate 80. Further, it is also possible that core laminates having mutually different circuit patterns are formed on both sides of the support plate 80. The following description is given with reference to FIG. 3A-3F that illustrate an example in which the same circuit patterns are formed on both sides of the support plate 80. Therefore, the description is given regarding only one side, and the description regarding the other side and reference numeral symbols for the other side in the drawings are omitted.

Figure 3B:
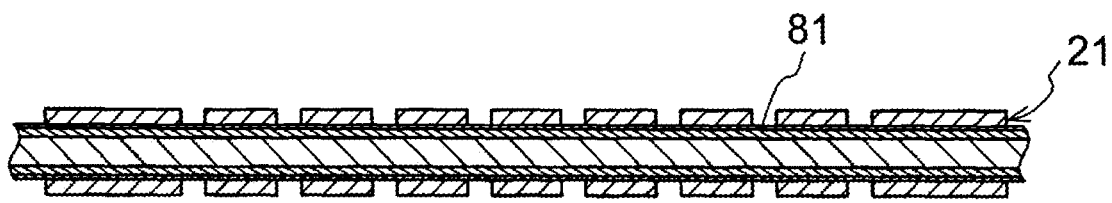
FIG. 3B is an explanatory diagram of a process of the method for manufacturing the printed wiring board illustrated in FIG. 1.

Next, as illustrated in FIG. 3B, the first conductor layer 21 is formed on the base metal foil 81. A method for forming the first conductor layer 21 is not particularly limited. However, for example, an electroplating method is use. Specifically, first, a plating resist film (not illustrated in the drawings) is formed in a predetermined region other than a portion where the first conductor layer 21 is formed on the base metal foil 81. Next, a plating film is formed by, for example, electroplating using the base metal foil 81 as a seed layer on a portion of the base metal foil 81 where the plating resist film is not formed. Thereafter, the plating resist film is removed. As a result, as illustrated in FIG. 3B, the first conductor layer 21 made of the electroplating film is formed on the base metal foil 81. The first conductor layer 21 is preferable an electroplating film made of copper.

Figure 3C:
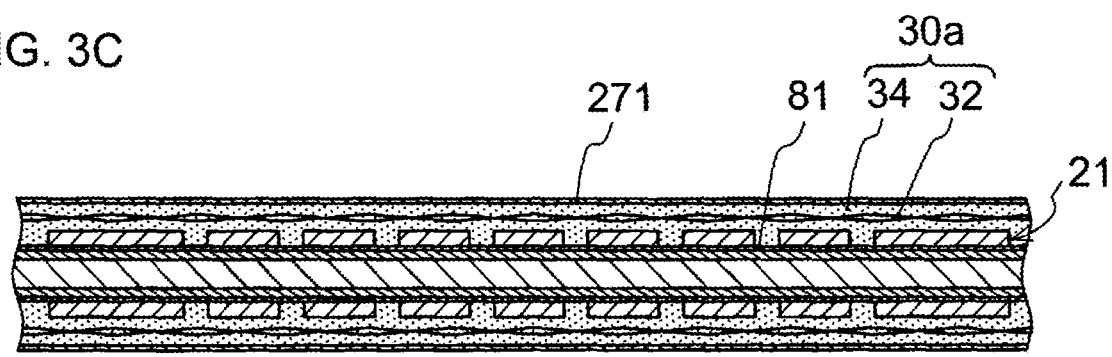
FIG. 3C is an explanatory diagram of a process of the method for manufacturing the printed wiring board illustrated in FIG. 1.

Next, as illustrated in FIG. 3C, the insulating layer (prepreg) (30*a*) in a semi-cured state is laminated on the base metal foil 81 and on the first conductor layer 21. Further, the metal foil 271 is laminated on the insulating layer (30*a*). Thereafter, the metal foil 271 and the insulating layer (30*a*) are pressed toward the support plate 80 side are further heated. As a result, the insulating layer (30*a*) is completely cured and, at the same time, is bonded to the base metal foil 81 and the first conductor layer 21 and to the metal foil 271. In FIG. 3C, the insulating layer (30*a*) is illustrated as being formed by the core material 32 and the resin material 34 made of a resin composition. However, it is also possible that the insulating layer (30*a*) is formed of only the resin material 34 without including the core material 32. Further, the core material 32 may be inorganic fiber such as a glass cloth.

Figure 3D:
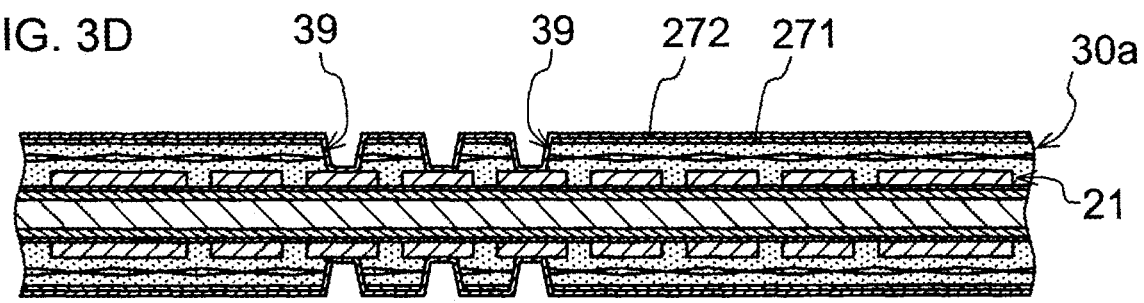
FIG. 3D is an explanatory diagram of a process of the method for manufacturing the printed wiring board illustrated in FIG. 1.

Next, as illustrated in FIG. 3D, through holes 39 that penetrate the metal foil 271 and the insulating layer (30*a*) and expose the first conductor layer 21 are formed. Specifically, laser light is irradiated using, for example, $CO_2$ laser from a surface side of the metal foil 271 to predetermined positions on the metal foil 271. As a result, as illustrated in FIG. 3D, the through holes 39 are formed. After the formation of the through holes 39, preferably, desmear is performed with respect to the through holes 39. Further, in order to improve absorption efficiency of laser light, the surface of the metal foil 271 may be subjected to a blackening treatment before laser light irradiation. As illustrated in FIG. 3D, the through holes 39 may be formed to have a larger hole size on the side to which the $CO_2$ laser is irradiated, that is, the metal foil 271 side, than on the first conductor layer 21 side. When the through holes 39 are each formed in such a shape, there is an advantage that, for example, when the first metal film 272 and the second metal film 273 are formed using a wet plating method in the next process, it is easy for a plating solution to enter deep into the through holes 39.

Next, the first metal film 272 is formed on the metal foil 271 and in the through holes 39. As will be described later, the first metal film 272 functions as a seed layer when the second metal film 273 is formed by electroplating. The first metal film 272 is preferably formed by electroless plating. When formed by electroless plating, the first metal film 272 preferably has a thickness of 0.3-1 µm. In other preferred examples, the first metal film 272 is formed using a sputtering method. When formed using a sputtering method, the first metal film 272 preferably has a thickness of 0.05-0.2 µm. A material of the first metal film 272 is not particularly limited. However, copper is preferably used. However, the method and the material for forming the first metal film 272 are not limited to these. Other methods and materials may also be used.

Figure 3E:
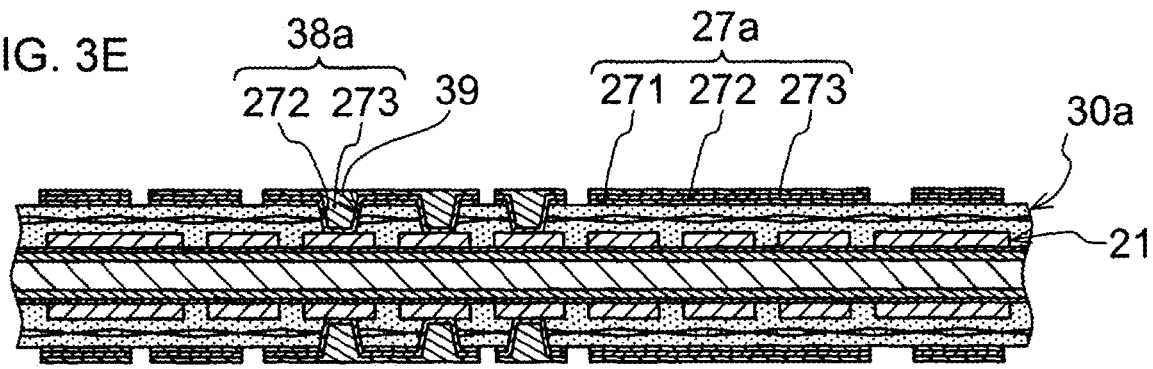
FIG. 3E is an explanatory diagram of a process of the method for manufacturing the printed wiring board illustrated in FIG. 1.

Next, as illustrated in FIG. 3E, the second metal film 273 is formed on the first metal film 272. A method for forming the second metal film 273 is not particularly limited. However, forming the second metal film 273 using an electroplating method is preferable in that a thick film can be formed in a short time period. When the second metal film 273 is formed using an electroplating method, first, a plating resist film (not illustrated in the drawings) is formed on the first metal film 272. The plating resist film is formed outside areas above the through holes 39 and on portions of the first metal film 272 where the inner-layer conductor layer (27*a*) is not formed. Next, the second metal film 273 is formed by electroplating inside the through holes 39 and on portions of the first metal film 272 where the plating resist film is not formed. As a result, the through holes 39 are filled with the second metal film 273 and, as illustrated in FIG. 3E, the via conductors (38*a*) made of the first and second metal films (272, 273) are formed.

Next, the plating resist film is peeled off. The first metal film 272 that is exposed by peeling off the plating resist film and the metal foil 271 below the first metal film 272 are removed, for example, by etching. As a result, as illustrated in FIG. 3E, the inner-layer conductor layer (27*a*) including the metal foil 271, the first metal film 272 and the second metal film 273 is formed on a surface of the insulating layer (30*a*) on a side where the first conductor layer 21 is not embedded.

Figure 3F:
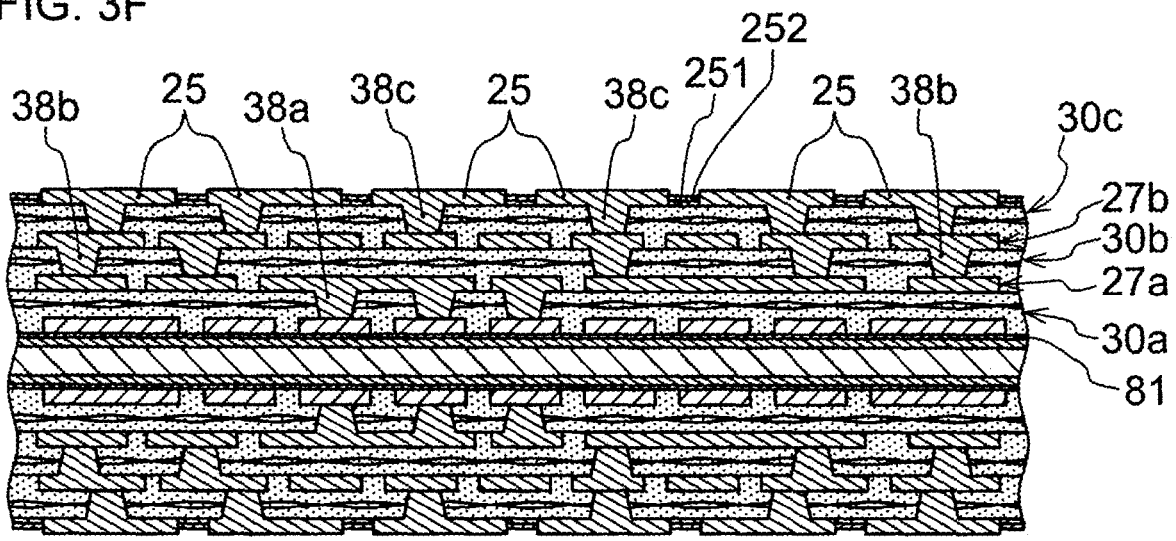
FIG. 3F is an explanatory diagram of a process of the method for manufacturing the printed wiring board illustrated in FIG. 1.

Next, as illustrated in FIG. 3F, the insulating layer (30*b*), the inner-layer conductor layer (27*b*), the insulating layer (30*c*) and the second conductor layer 25 are sequentially laminated and formed on the inner-layer conductor layer (27*a*) and on the portion of the insulating layer (30*a*) where the inner-layer conductor layer (27*a*) is not formed. Further, along with the formation of the inner-layer conductor layer (27*b*), the via conductors (38*b*) that connect the inner-layer conductor layer (27*b*) and the inner-layer conductor layer (27*a*) are formed, and long with the formation of the second conductor layer 25, the via conductors (38*c*) that connect the second conductor layer 25 and the inner-layer conductor layer (27*b*) are formed. The insulating layer (30*b*), the inner-layer conductor layer (27*b*) and the via conductors (38*b*), and the insulating layer (30*c*), the second conductor layer 25 and the via conductors (38*c*) can be respectively formed in the same way as the insulating layer (30*a*), the inner-layer conductor layer (27*a*) and the via conductors (38*a*) by repeating the same processes as the processes illustrated in FIG. 3C-3E. By repeating a large (small) number of times the processes illustrated in FIG. 3C-3E, a large (small) number of insulating layers 30 (see FIG. 1), inner-layer conductor layers 27 (see FIG. 1) and via conductors 38 (see FIG. 1) can be respectively formed. Here, in the process in which the second conductor layer 25 is formed, portions of the metal foil 251 and the first metal film 252 where the plating resist film (not illustrated in the drawings) is formed may remain as illustrated in FIG. 3F, without being immediately removed following the peeling of the plating resist film. This is because the remaining portions of the metal foil 251 and the first metal film 252 can be removed together with the base metal foil 81 as will be described later. In the example illustrated in FIG. 3F, the via conductors (38b, 38c) are formed such that the horizontal cross sections of the via conductors (38b, 38c) expand (shrink) in the same direction as the direction in which the horizontal cross sections of the via conductors (38a) expand (shrink).

Figure 3G:
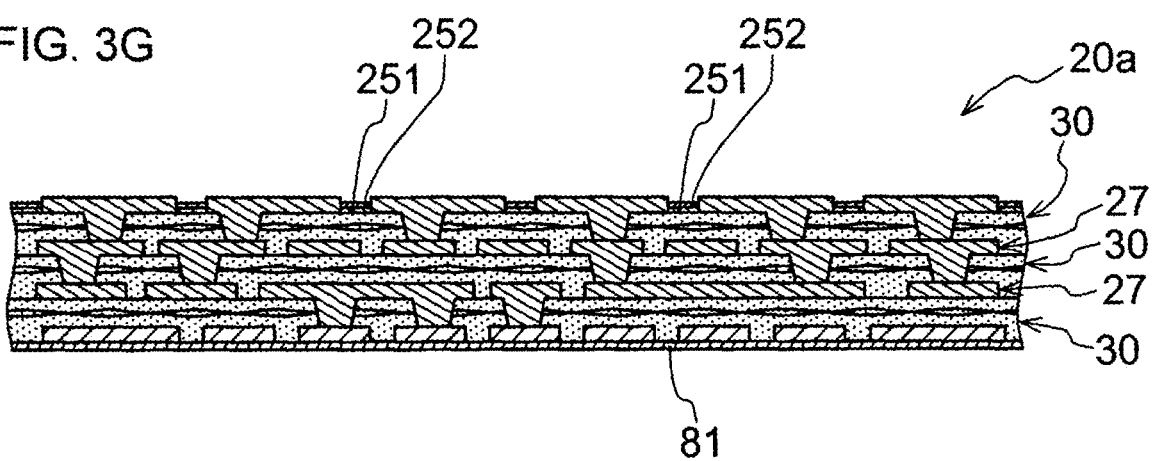
FIG. 3G is an explanatory diagram of a process of the method for manufacturing the printed wiring board illustrated in FIG. 1.

Next, the support plate 80 and the carrier copper foil (80a) are separated from the base metal foil 81. Specifically, first, for example, in a state in which the core laminate in a halfway process illustrated in FIG. 3F is heated and the thermoplastic adhesive (not illustrated in the drawings) that bond the carrier copper foil (80a) and the base metal foil 81 is softened, a force is applied to the support plate 80 and the carrier copper foil (80a) in a direction along an interface with the base metal foil, and the two are separated. Or, as described above, when the carrier copper foil (80a) and the base metal foil 81 are bonded by an adhesive or by ultrasound connection in the margin portion of the vicinity of the outer periphery, it is also possible that the carrier copper foil (80a), the base metal foil 81 and the support plate 80 together with the insulating layer (30a) and the like are cut on an inner peripheral side than the bonding area and the bonding area due to the adhesive or the like is removed, and thereby, the carrier copper foil (80a) and the base metal foil 81 is separated. As a result, laminates that are formed on the surfaces on both sides of the support plate 80 and each include the insulating layers 30, the inner-layer conductor layers 27 and the like are each a halfway-processed product (20a) of an individual core laminate. The halfway-processed product (20a) of the core laminate in this state is illustrated in FIG. 3G. FIG. 3G illustrates only the halfway-processed product (20a) of the core laminate that includes the insulating layer (30a), the inner-layer conductor layer (27a) and the like that are illustrated on the upper side of the support plate 80 in FIG. 3F.

Figure 3H:
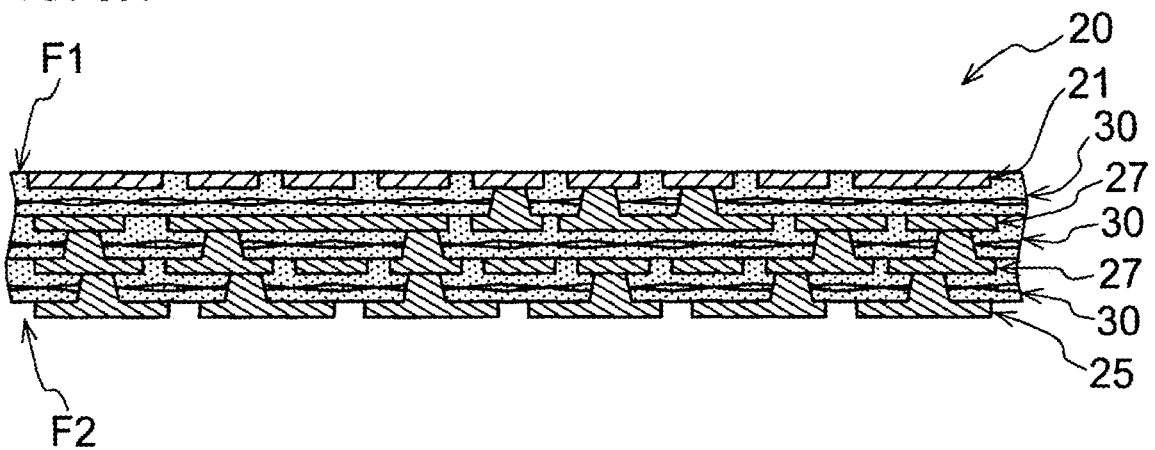
FIG. 3H is an explanatory diagram of a process of the method for manufacturing the printed wiring board illustrated in FIG. 1.
Figure 3I:
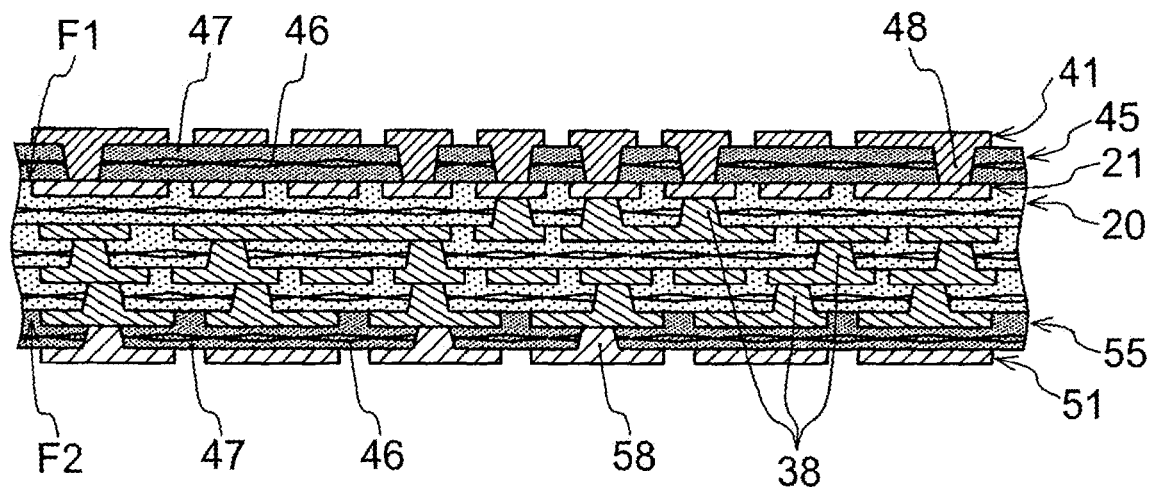
FIG. 3I is an explanatory diagram of a process of the method for manufacturing the printed wiring board illustrated in FIG. 1.
Figure 3J:
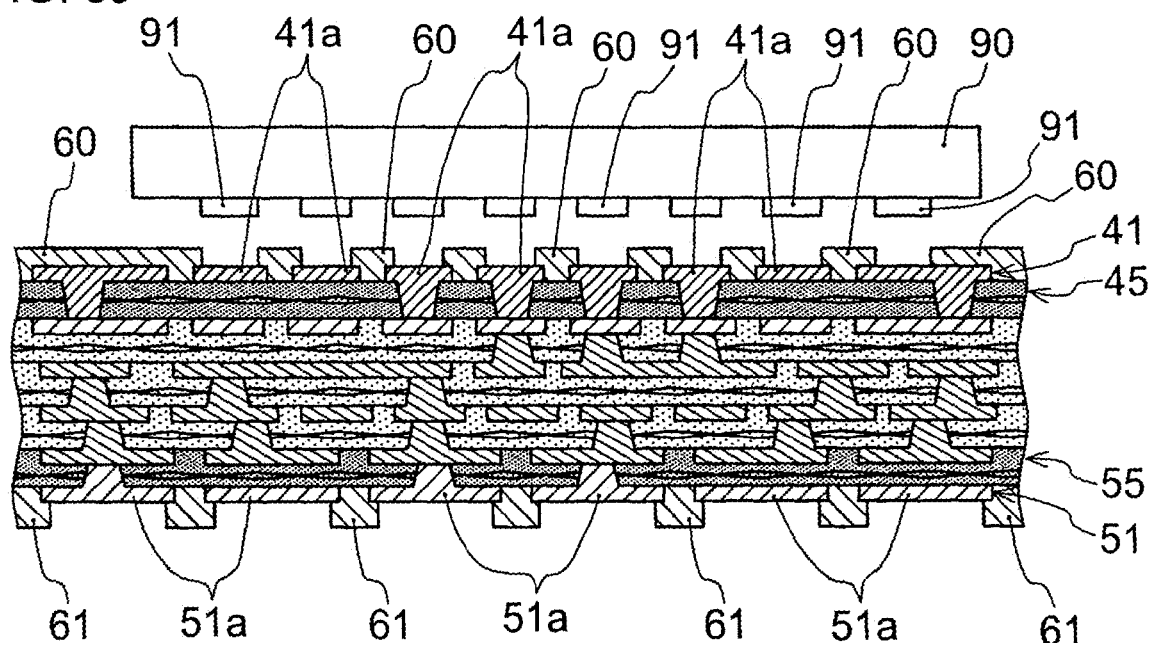
FIG. 3J is an explanatory diagram of a process of the method for manufacturing the printed wiring board illustrated in FIG. 1.

Next, the base metal foil 81 is removed, for example, by etching or the like. As described above, even when the portions of the metal foil 251 and the first metal film 252 where the plating resist film (not illustrated in the drawings) is formed remain without being removed, the portions of the metal foil 251 and the first metal film 252 can be removed together with the base metal foil 81 is the process in which the base metal foil 81 is removed. In this way, when the metal foil 251 and the first metal film 252 are removed in the same process as the base metal foil 81, at least one etching process or the like can be omitted. Therefore, the manufacturing process of the wiring board is shortened and manufacturing cost is reduced. By removing the base metal foil 81, one surface of the first conductor layer is exposed. As a result, as illustrated in FIG. 3H, the core laminate 20 is complete, having the first surface (F1) and the second surface (F2) that is on the opposite side of the first surface (F1), being formed by alternately laminating the inner-layer conductor layers 27 and the insulating layers 30, and having the first conductor layer 21 that has one surface exposed and is embedded in the insulating layer 30 on the first surface (F1) side and the second conductor layer 25 that is formed on the second surface (F2) side. FIG. 3H illustrates the core laminate 20 in an orientation in which the halfway-processed product (20a) of the core laminate illustrated in FIG. 3G is rotated for 180 degrees about an axis perpendicular to the drawing so as to match the wiring board 10 illustrated in FIG. 1. In FIGS. 3I and 3J that are referenced in the following description, the core laminate 20 is illustrated in the same orientation as in FIG. 3H.

Next, as illustrated in FIG. 3I, on the first surface (F1) of the core laminate 20, the first interlayer resin insulating layer 45 is laminated. Further, the via conductors 48 that penetrate through the first interlayer resin insulating layer 45 and formed and the third conductor layer 41 is formed on the first interlayer resin insulating layer 45. Further, on the second surface (F2) of the core laminate 20, the second interlayer resin insulating layer 55 is laminated. Further, the via conductors 58 that penetrate through the second interlayer resin insulating layer 55 are formed and the fourth conductor layer 51 is formed on the second interlayer resin insulating layer 55. The first interlayer resin insulating layer 45, the third conductor layer 41 and the via conductors 48, and the second interlayer resin insulating layer 55, the fourth conductor layer 51 and the via conductors 58 can be respectively formed in the same way as the insulating layer (30a), the inner-layer conductor layer (27a) and the via conductors (38a) of the core laminate 20 by repeating the same processes as the processes illustrated in FIG. 3C-3E. Therefore, regarding these processes, a detailed description with reference to the drawings is omitted, and a schematic description is given below.

First, an insulating layer (prepreg) in a semi-cured state and a metal foil are laminated on each the first surface (F1) and the second surface (F2) of the core laminate 20 and are bonded thereto by pressing and heating. As a result, the first interlayer resin insulating layer 45 is formed on the first surface (F1) and the second interlayer resin insulating layer 55 is formed on the second surface (F2). Next, through holes that penetrate through the metal foil on the first surface (F1) side and the first interlayer resin insulating layer 45 and expose the first conductor layer 21 are formed, and through holes that penetrate through the metal foil on the second surface (F2) side and the second interlayer resin insulating layer 55 and expose the second conductor layer 25 are formed The through holes are formed, for example, by irradiating laser light from a surface side of each of the metal foils. Next, a first metal film is formed on each of the metal foils and in each of the through holes preferably using an electroless plating method or a sputtering method. Next, a second metal film is formed on the first metal film preferably using an electroplating method. In this case, first, a plating resist film is formed outside areas above the through holes and on portions of the first metal film where the third conductor layer and the fourth conductor layer are not formed. Next, a second metal film is formed by electroplating in the through holes and on portions of the first metal film where the plating resist film is not formed. As a result, the through holes are filled with the second metal film and, as illustrated in FIG. 3I, the via conductors 48 are formed in the first interlayer resin insulating layer 45 and the via conductors 58 are formed in the second interlayer resin insulating layer 55. Next, the plating resist film is peeled off. The first metal film that is exposed by peeling off the plating resist film and the metal foil below the first metal film are removed by etching or the like. As a result, as illustrated in FIG. 3I, the third conductor layer 41 is formed on the first interlayer resin insulating layer 45, and the fourth conductor layer 51 is formed on the second interlayer resin insulating layer 55. The third conductor layer 41 is formed, for example, by being pattern in a predetermined conductor pattern including the connection pads (41a) (see FIG. 3J) and the like by providing the above-described plating resist film in a suitable pattern on the first metal film. Similarly, the fourth conductor layer 51 is formed, for example, by being patterned in a predetermined conductor pattern including the connection pads (51a) (see FIG. 3J) and the like.

In the method for manufacturing the wiring board 10 of the present embodiment, as described above, the processes in which the first interlayer resin insulating layer 45, the via conductors 48 and the third conductor layer 41 are formed and the processes in which the second interlayer resin insulating layer 55, the via conductors 58 and the fourth conductor layer 51 are formed can be simultaneously performed on the first surface (F1) side and on the second surface (F2) side of the core laminate 20. Therefore, in the processes in which the core laminate 20 is formed (see FIG. 3B-3F), manufacturing lead time from input to completion of the wiring board 10 can be shortened, for example, as compared to forming the core laminate by further laminating two sets of insulating layers and conductor layers on only one side of the second conductor layer 25 and the like.

Further, in method for manufacturing the wiring board 10 of the present embodiment, the first conductor layer 21 is embedded in the first surface (F1) of the core laminate. Therefore, as illustrated in FIG. 3I, the first interlayer resin insulating layer 45 that is laminated on the first surface is thicker than the second interlayer resin insulating layer 55 that is laminated on the second surface (F2). Therefore, the above-described warpage of the wiring board 10 is reduced, and reduction in the connection reliability of the electronic component (not illustrated in the drawings) that is mounted on the wiring board 10 can be prevented. Further, the first conductor layer 21 is embedded in the first surface (F1). Therefore, the first surface (F1) of the core laminate 20 is a substantially flat surface, and occurrence of unevenness on the surface of the wiring board 10 is suppressed and thus, as described above, reduction in the yield of mounting the electronic component to the wiring board 10 can be prevented.

In the above-described formation of the via conductors 48 and the via conductors 58, the through holes, in which the via conductors 48 are formed, are formed by irradiating laser light to the first interlayer resin insulating layer 45 from the side on which the third conductor layer 41 is formed. The through holes, in which the via conductors 58 are formed, are formed by irradiating laser light to the second interlayer resin insulating layer 55 from the side on which the fourth conductor layer 51 is formed. Therefore, in the example illustrated in FIG. 3I, the via conductors 48, the via conductors 58 and the via conductors 38 are formed in shapes such that cross sections of the via conductors 48 expand (shrink) in a direction opposite to a direction in which cross sections of the via conductors 58 and the via conductors 38 expand (shrink).

In FIG. 3I, the first and second interlayer resin insulating layers (45, 55) are illustrated to each include the core material 46. However, the first and second interlayer resin insulating layers (45, 55) may also be formed of only the resin material 47 made of a resin composition without the core material 46. Further, the core material 46 may be inorganic fiber such as a glass cloth. Further, in the resin material 47, for example, an inorganic filler (not illustrated in the drawings) such as silica may be included at a content rate of about 30-70 wt %.

Next, as illustrated in FIG. 3J, the solder resist layer 60 is formed on a portion of the surface of the third conductor layer 41 excluding the connection pads (41a) and on the surface of the first interlayer resin insulating layer 45 where the third conductor layer 41 is not formed. Further, the solder resist layer 61 is formed on a portion of the surface of the fourth conductor layer 51 excluding the connection pads (51a) and on the surface of the second interlayer resin insulating layer 55 where the fourth conductor layer 51 is not formed.

The solder resist layers (60, 61) are for lied, for example, as follows. A layer of a photosensitive epoxy material or the like is formed on entire surfaces of the first interlayer resin insulating layer 45 and the third conductor layer 41 and on entire surfaces of the second interlayer resin insulating layer 55 and the fourth conductor layer 51. Thereafter, predetermined portions of the epoxy material layer where the solder resist layers (60, 61) are formed are exposed, and unexposed portions of the epoxy material layer are removed by development. However, without being limited to this, the solder resist layers (60, 61) may also be provided using other methods such as screen printing in which a mask that opens to a predetermined pattern is used. Further, the solder resist layers (60, 61) may also be formed, for example, as follows. A layer made of a non-photosensitive epoxy material or the like is formed on the entire surfaces of the first interlayer resin insulating layer 45 and the third conductor layer 41 and on the entire surfaces of the second interlayer resin insulating layer 55 and the fourth conductor layer 51. Thereafter, portions of the epoxy material layer where the solder resist layers (60, 61) are not formed are removed using laser.

Further, a corrosion-resistant layer (not illustrated in the drawings) made of, for example, Ni/Au, Ni/Pd/Au or Sn may be formed on surfaces of the connection pads (41a, 51a) that are not covered by and exposed from the solder resists (60, 61). Further, a corrosion-resistant layer made of an organic protective film (OSP) may be formed by immersion in a liquid protective material spraying a protective material, or the like. Or, a solder coating layer (not illustrated in the drawings) may be formed.

Through the processes illustrated in FIG. 3A-3J, the wiring board 10 of the present embodiment illustrated in FIG. 1 is completed. As illustrated in FIG. 3J, for example, an electronic component such as the semiconductor element 90 may be connected to the connection pads (41a) of the completed wiring board 10. Similarly, another electronic component (not illustrated in the drawings) may be connected to the connection pads (51a). Further, the wiring board 10 may be connected to an external circuit such as another wiring board via the connection pads (41a, 51a).

Further, the method for manufacturing the wiring board 10 of the present embodiment is not limited to the method described with reference to FIG. 3A-3J. The conditions, processing order and the like of the method may be arbitrarily modified. Further, certain processes may be omitted and other processes may be added.

Next, a semiconductor package of an embodiment of the present invention is described with reference to the drawings. As illustrated in FIG. 4A, a semiconductor package 100 of the embodiment includes a printed wiring board 110 and a substrate 130. A first semiconductor element 115 is mounted to a surface (F3) of the printed wiring board 110. The substrate 130 is mounted on the surface (F3) of the printed wiring board 110. Preferably, the printed wiring board of which an example is illustrated in FIG. 1 is used as the printed wiring board 110. FIG. 4A illustrates as example in which the printed wiring board of which an example is illustrated in FIG. 1 is used as the printed wiring board 110. Therefore, most of structural elements of the printed wiring board 110 illustrated in FIG. 4A are the same as those of the printed wiring board 10 illustrated in FIG. 1, and such structural elements are indicated using the same reference numeral symbols and detailed description thereof is omitted. However, the printed wiring board 110 is not limited to the printed wiring board 10 illustrated in FIG. 1, but may incorporate various modifications and variations with respect to the respective structural elements as indicated in the above description of the printed wiring board 10.

As illustrated in FIG. 4A, in the printed wiring board 110, a third conductor layer 141 is formed on the surface (F3), and a solder resist layer 160 is formed on the third conductor layer 141. The solder resist layer 160 has openings 161 at predetermined portions thereof. Connection pads (141a, 141b) that form a portion of the third conductor layer 141 are exposed from the openings 161 of the solder resist layer 160.

The substrate 130 has bumps 124 on a surface on the printed wiring board 110 side. The bumps 124 are connected to the connection pads (141b) that form a portion of the third conductor layer 141 of the printed wiring board 110.

Further, the first semiconductor element 115 is arranged in a space that is between the printed wiring board 110 and the substrate 130 and has a height in accordance with a height of the bumps 124. Further, the first semiconductor element 115 has electrodes 116. The electrodes 116 are connected via a joining material 122 to the connection pads (141a) that form a portion of the third conductor layer 141 of the printed wiring board 110.

The semiconductor package 100 of the present embodiment has the printed wiring board 110 that is similar to the above-described printed wiring board 10 of the embodiment illustrated in FIG. 1. Therefore, as described above, warpage of the printed wiring board 110 can be reduced and reduction in connection reliability of the first semiconductor element 115 and the substrate 130 can be prevented. Further, occurrence of unevenness on the surface of the printed wiring board 110 is suppressed. Therefore, reduction in the yield of mounting the first semiconductor element 115 can be prevented.

The structure and material of the substrate 130 are not particularly limited. Any substrate may be used as the substrate 130, such as a printed wiring board that is formed by an insulating layer made of a resin material and conductor layer made of a copper foil or the like, a wiring board obtained by forming a conductor film on a surface of an insulating substrate made of an inorganic material such as alumina or aluminum nitride, and a motherboard substrate manufactured using a method described in FIG. 8-13 of International Publication No. 11/122246. Further, the first semiconductor element 115 is also not particularly limited. Any semiconductor element can be used as the first semiconductor element 115, such as a microcomputer, a memory, and an ASIC. The third conductor layer 141 and the solder resist layer 160 can be formed using the same material and method as those for the third conductor layer 41 and the solder resist layer 60 of the above-described printed wiring board 10.

The materials for the joining material 122 and the bumps 124 are also not particularly limited. Any conductive material, preferably, metal such as solder, gold and copper can be used. Further, it is also possible that, without using the joining material 122, the electrodes 116 of the first semiconductor element 115 and the connection pads (141a) are connected by forming inter-metal junctions therebetween by applying heat, pressure and/or vibration.

Figure 4B:
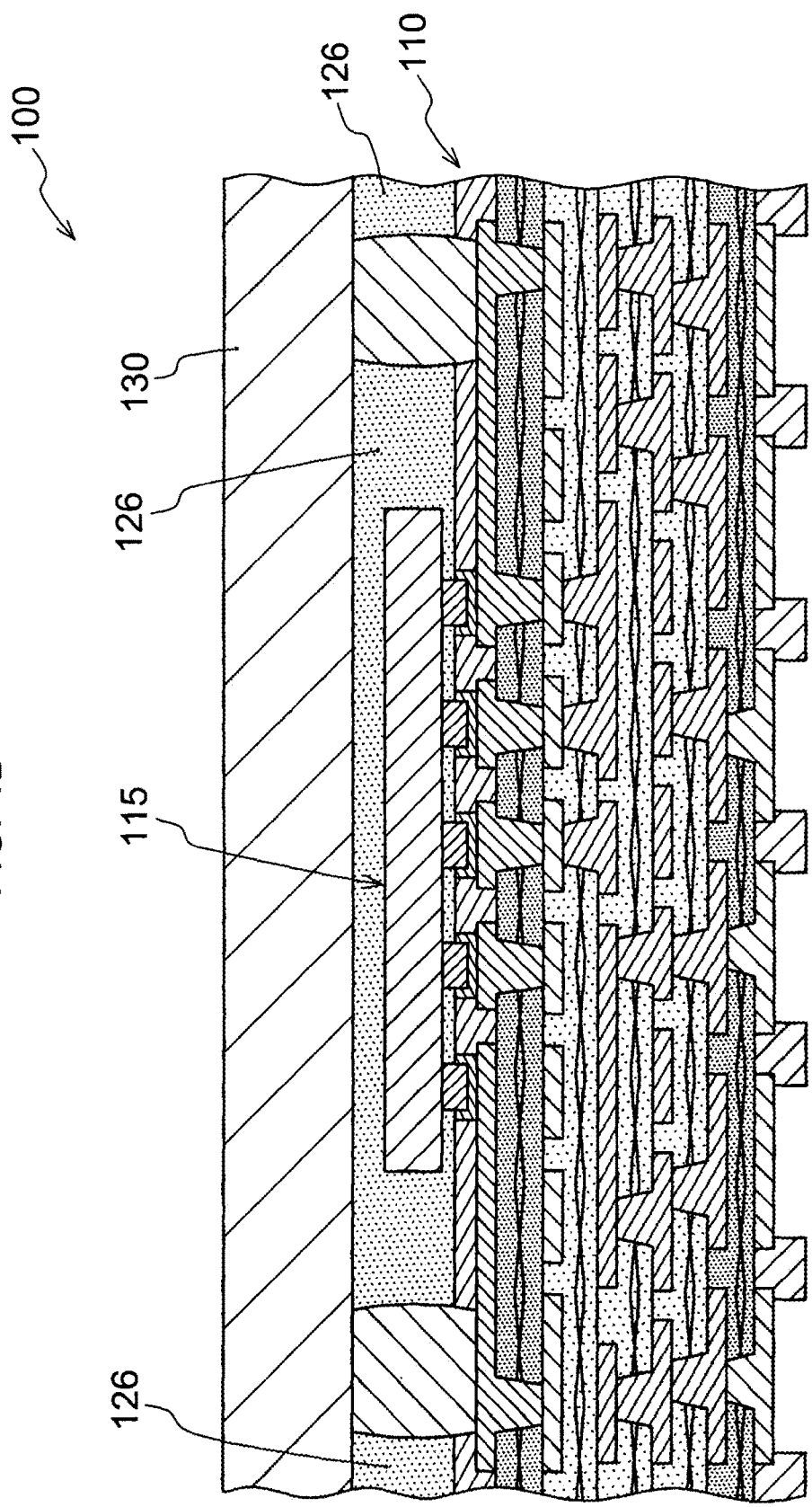
FIG. 4B is a cross-sectional view of another example of a semiconductor package of an embodiment of the present invention.

FIG. 4B illustrates an example in which gaps between the printed wiring board 110 and the substrate 130 of the semiconductor package 100 illustrated in FIG. 4A are filled with mold resin 126. In this way, when the gaps are filled with the mold resin 126, along with that the first semiconductor element 115 is protected from mechanical stresses, there are advantages that the behavior of the printed wiring board 110 due to ambient temperature variation is limited, stresses occurring in portions connecting to the first semiconductor element 115 are reduced and the connection reliability is improved. The material for the mold resin 126 is not particularly limited. However, for example, a material that has a thermal expansion coefficient close to that of the first semiconductor element 115 and has good insulation performance is used. Preferably, as the mold resin 126, thermosetting epoxy resin containing a suitable amount of filler such as silica is used. A method for filling the gaps with the mold resin 126 is not particularly limited. For example, the filling may be performed by transfer molding in a mold (not illustrated in the drawings), or by injecting liquid resin and thereafter applying heat to perform curing.

FIG. 4C illustrates an example in which a second semiconductor element 135 is mounted on the substrate 130 of the semiconductor package 100 illustrated in FIG. 4B. As illustrated in FIG. 4C, electrodes (not illustrated in the drawings) that are provided on one surface of the second semiconductor element 135 are connected to the substrate 130 by bonding wires 137, or, the connection may be performed using a flip-chip mounting method by inverting the second semiconductor element 135 so that the surface on which the electrodes are provided faces downward. In this way, by making the semiconductor package in a package-on-package structure in which the second semiconductor element 135 is mounted, a size in a plan view can be reduce and a sophisticated semiconductor device can be provided.

Figure 5:
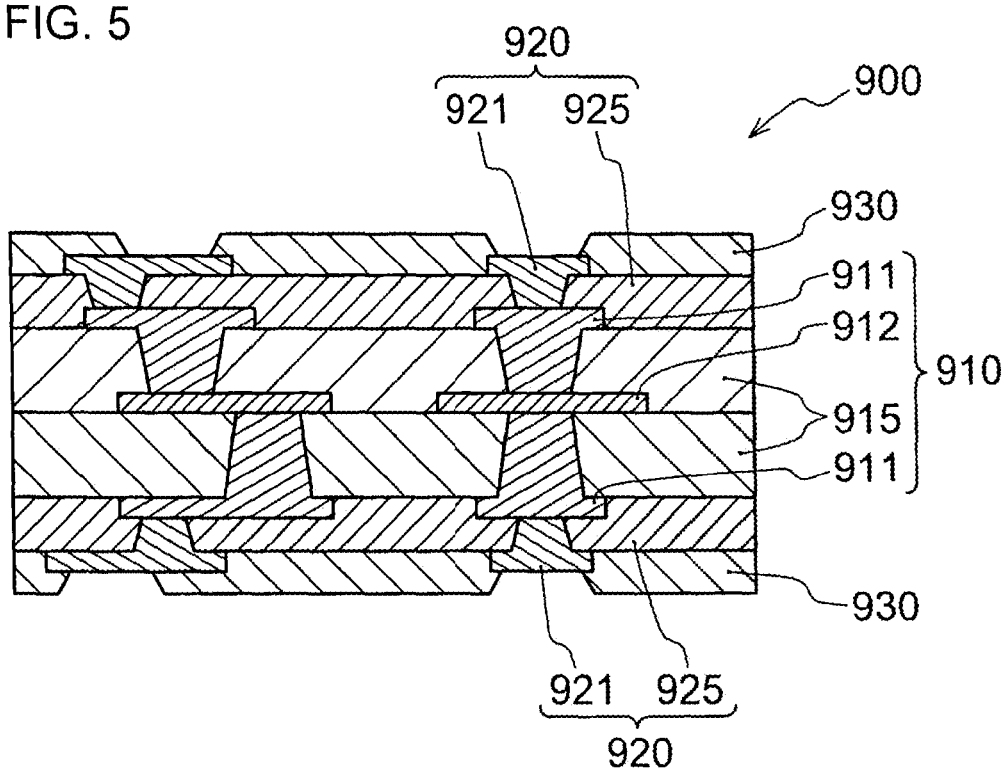
FIG. 5 illustrates a cross-sectional view of a printed wiring board according to the conventional technology.

In recent years, as circuits in electronic devices have become more complicated, the number of electrodes of an electronic component has increased. On the other hand, size reduction in electronic devices has rapidly progressed. Therefore, a printed wiring board that allows a wiring pattern to be arranged at a high density and allows a semiconductor element or the like having bumps and a large number of land-type electrodes arranged at a narrow pitch to be mounted with a high yield is demanded. As a printed wiring board that allows a pattern to be formed at a high density, a build-up wiring board may be used that is formed by using a double-sided copper-clad laminated plate, or a laminated plate that is forming by alternately laminating insulating layers and conductor layers, as a core substrate, and laminating a build-up layer that includes an insulating layer and a conductor layer on both surfaces of the core substrate. That is, as illustrated in FIG. 5, a build-up wiring board 900 is formed, for example, by laminating a build-up layer 920 that includes a conductor layer 921 and an insulating layer 925 on a surface on each of both sides of a core substrate 910 that includes conductor layers (911, 912) and two insulating layers 915. Further, a solder resist 930 is formed on a predetermined portion of the build-up layer 920.

In the build-up wiring board 900 illustrated in FIG. 5, the conductor layers 911 on both surfaces of the core substrate 910 are provided to be patterned in predetermined patterns on surfaces of the insulating layers 915. Therefore, unevenness corresponding to the thicknesses of the conductor layers 911 exists on both the front and back surfaces of the core substrate 910 on which the build-up layers 920 are laminated. When such unevenness exists, undulation may also occur on the surfaces of the build-up wiring board 900.

When such undulation exists, when a semiconductor element (not illustrated in the drawings) or the like is connected to the conductor layer 921, it is possible that the conductor layer 921 cannot be in contact with all electrodes of the semiconductor element and a yield of mounting the semiconductor element or the like is reduced.

A printed wiring board according to an embodiment of the present invention has a flat surface, and a semiconductor package according to an embodiment of the present invention includes such a printed wiring board.

A printed wiring board according to an embodiment of the present invention includes: a core laminate that is formed by alternately laminating insulating layers and conductor layers, and has a first conductor layer on a first surface and a second conductor layer on a second surface that is on an opposite side of the first surface; a first build-up layer that is provided on the first surface of the core laminate and includes a first interlayer resin insulating layer and a third conductor layer that is laminated on the first interlayer resin insulating layer; and a second build-up layer that is provided on the second surface of the core laminate and includes a second interlayer resin insulating layer and a fourth conductor layer that is laminated on the second interlayer resin insulating layer. The first conductor layer is embedded in an insulating layer of the first surface of the core laminate and has one surface exposed from the insulating layer. The second conductor layer is formed on an insulating layer of the second surface of the core laminate. The first interlayer resin insulating layer is thicker than the second interlayer resin insulating layer.

A semiconductor package of an embodiment of the present invention includes a printed wiring board and a substrate. A first semiconductor element is mounted to a surface of the printed wiring board. The substrate is mounted on the surface of the printed wiring board. The printed wiring board includes: a core laminate that is formed by alternately laminating insulating layers and conductor layers, and has a first conductor layer on a first surface and a second conductor layer on a second surface that is on an opposite side of the first surface; a first build-up layer that is provided on the first surface of the core laminate and includes a first interlayer resin insulating layer and a third conductor layer that is laminated on the first interlayer resin insulating layer; a second build-up layer that is provided on the second surface of the core laminate and includes a second interlayer resin insulating layer and a fourth conductor layer that is laminated on the second interlayer resin insulating layer; and a solder resist layer that is formed on the third conductor layer. The first conductor layer is embedded in an insulating layer of the first surface of the core laminate and has one surface exposed from the insulating layer. The second conductor layer is formed on an insulating layer of the second surface of the core laminate. The first interlayer resin insulating layer is thicker than the second interlayer resin insulating layer. Further, the substrate has bumps on a surface on the printed wiring board side. The bumps are connected to the third conductor layer that is exposed to openings provided in the solder resist layer.

Further, a method for manufacturing a printed wiring board according to an embodiment of the present invention includes: a process of forming a core laminate that has a first surface and a second surface that is on an opposite side of the first surface by alternately laminating insulating layers and conductor layers on a support plate and separating the laminated insulating layers and conductor layers from the support plate; and a process of laminating a first interlayer resin insulating layer on the first surface of the separated core laminate and laminating a second interlayer resin insulating layer on the second surface. The core laminate is formed to have a first conductor layer that is embedded in the first surface in a manner that one surface of the first conductor layer is exposed from the first surface. The first interlayer resin insulating layer and the second interlayer resin insulating layer are formed to have different thicknesses.

According to an embodiment of the present invention, the first conductor layer is embedded in the insulating layer of the first surface of the core laminate. Therefore, the first surface of the core laminate can be made flat. Therefore, the surface of the printed wiring board on the first surface side can be made flat. As a result, when an electronic component is mounted to the printed wiring board, contact failure with a conductor pattern of the printed wiring board is unlikely to occur, and a yield of mounting the electronic component to the printed wiring board is improved. Similarly, a yield of a semiconductor package that uses the printed wiring board is improved.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core laminate comprising a plurality of insulating layers and a plurality of conductor layers;
   a first build-up layer formed on a first surface of the core laminate and comprising a first interlayer resin insulating layer and a conductor layer laminated on the first interlayer resin insulating layer; and
   a second build-up layer formed on a second surface of the core laminate on an opposite side with respect to the first surface of the core laminate and comprising a second interlayer resin insulating layer and a conductor layer laminated on the second interlayer resin insulating layer,
   wherein the thickness of the first interlayer resin insulating layer is greater than a thickness of each of the insulating layers in the core laminate, the plurality of conductor layers in the core laminate includes a first conductor layer and a second conductor layer such that the first conductor layer is embedded in one of the insulating layers forming the first surface of the core laminate and has an exposed surface exposed from the insulating layer and that the second conductor layer is formed on one of the insulating layers forming the second surface of the core laminate, the first interlayer resin insulating layer has a thickness which is greater than a thickness of the second interlayer resin insulating layer, the first build-up layer includes a plurality of via conductors formed through the first interlayer resin insulating layer, the second build-up layer includes a plurality of via conductors formed through the second interlayer resin insulating layer, the core laminate includes a plurality of via conductors formed through the plurality of insulating layers, and the plurality of via conductors in the second build-up layer and the plurality of via conductors in the core laminate are formed such that the plurality of via conductors in the second build-up layer and the plurality of via conductors in the core laminate are tapering in an opposite direction with respect to a tapering direction of the plurality of via conductors in the first build-up layer.

2. A printed wiring board according to claim 1, wherein the first interlayer resin insulating layer comprises a prepreg comprising resin material and inorganic fiber core material impregnated in the resin material, and the second interlayer resin insulating layer comprises a prepreg comprising resin material and inorganic fiber core material impregnated in the resin material.

3. A printed wiring board according to claim 1, wherein the first interlayer resin insulating layer comprises resin material and inorganic filler material such that the inorganic filler material is in an amount of 30 wt. % to 70 wt. % with respect to the first interlayer resin insulating layer in total, and the second interlayer resin insulating layer comprises resin material and inorganic filler material such that the inorganic filler material is in an amount of 30 wt. % to 70 wt. % with respect to the second interlayer resin insulating layer in total.

4. A printed wiring board according to claim 1, wherein the first build-up layer is configured to mount a semiconductor component.

5. A printed wiring board according to claim 4, wherein the first interlayer resin insulating layer comprises a prepreg comprising resin material and inorganic fiber core material impregnated in the resin material, and the second interlayer resin insulating layer comprises a prepreg comprising resin material and inorganic fiber core material impregnated in the resin material.

6. A printed wiring board according to claim 4, wherein the first interlayer resin insulating layer comprises resin material and inorganic filler material such that the inorganic filler material is in an amount of 30 wt. % to 70 wt. % with respect to the first interlayer resin insulating layer in total, and the second interlayer resin insulating layer comprises resin material and inorganic filler material such that the inorganic filler material is in an amount of 30 wt. % to 70 wt. % with respect to the second interlayer resin insulating layer in total.

7. A printed wiring board according to claim 1, wherein each of the insulating layers comprises a prepreg comprising resin material and inorganic fiber core material impregnated in the resin material.

8. A semiconductor package, comprising:
a printed wiring board;
a semiconductor component mounted on a surface of the printed wiring board; and
a substrate mounted on the surface of the printed wiring board,
wherein the printed wiring board comprises a core laminate comprising a plurality of insulating layers and a plurality of conductor layers, a first build-up layer formed on a first surface of the core laminate and comprising a first interlayer resin insulating layer and a conductor layer laminated on the first interlayer resin insulating layer, a second build-up layer formed on a second surface of the core laminate on an opposite side with respect to the first surface of the core laminate and comprising a second interlayer resin insulating layer and a conductor layer laminated on the second interlayer resin insulating layer, and a solder resist layer formed on the conductor layer of the first build-up layer such that the solder resist layer has a plurality of opening portion exposing plural portions of the conductor layer, respectively, the thickness of the first interlayer resin insulating layer is greater than a thickness of each of the insulating layers in the core laminate, the plurality of conductor layers in the core laminate includes a first conductor layer and a second conductor layer such that the first conductor layer is embedded in one of the insulating layers forming the first surface of the core laminate and has an exposed surface exposed from the insulating layer and that the second conductor layer is formed on one of the insulating layers forming the second surface of the core laminate, the first interlayer resin insulating layer has a thickness which is greater than a thickness of the second interlayer resin insulating layer, the substrate has a plurality of bumps such that the plurality of bumps is connected to the plural portions of conductor layer exposed from the solder resist layer, respectively, the first build-up layer includes a plurality of via conductors formed through the first interlayer resin insulating layer, the second build-up layer includes a plurality of via conductors formed through the second interlayer resin insulating layer, the core laminate includes a plurality of via conductors formed through the plurality of insulating layers, and the plurality of via conductors in second build-up layer and the plurality of via conductors in the core laminate are formed such that the plurality of via conductors in the second build-up layer and the plurality of via conductors in the core laminate are tapering in an opposite direction with respect to a tapering direction of the plurality of via conductors in first build-up layer.

9. A semiconductor package according to claim 8, further comprising:
a mold resin body filling a space formed between the substrate and the printed wiring board,
wherein the semiconductor component is connected to the conductor layer of the first build-up layer and positioned the space between the substrate and the printed wiring board.

10. A semiconductor package according to claim 9, wherein the first interlayer resin insulating layer comprises a prepreg comprising resin material and inorganic fiber core material impregnated in the resin material, and the second interlayer resin insulating layer comprises a prepreg comprising resin material and inorganic fiber core material impregnated in the resin material.

11. A semiconductor package according to claim 8, further comprising:
a second semiconductor component mounted on the substrate such that the printed wiring board, the semiconductor component, the substrate and the second semiconductor component form a package-on-package structure.

12. A semiconductor package according to claim 8, wherein the first interlayer resin insulating layer comprises a prepreg comprising resin material and inorganic fiber core material impregnated in the resin material, and the second interlayer resin insulating layer comprises a prepreg comprising resin material and inorganic fiber core material impregnated in the resin material.

13. A semiconductor package according to claim 8, wherein the first interlayer resin insulating layer comprises resin material and inorganic filler material such that the inorganic filler material is in an amount of 30 wt. % to 70 wt. % with respect to the first interlayer resin insulating layer in total, and the second interlayer resin insulating layer comprises resin material and inorganic filler material such that the inorganic filler material is in an amount of 30 wt. % to 70 wt. % with respect to the second interlayer resin insulating layer in total.

14. A semiconductor package according to claim 8, wherein each of the insulating layers comprises a prepreg comprising resin material and inorganic fiber core material impregnated in the resin material.

15. A method for manufacturing a printed wiring board, comprising:
   forming on a support plate a core laminate comprising a plurality of insulating layers and a plurality of conductor layers;
   forming a plurality of via conductors through the plurality of insulating layers in the core laminate;
   removing the support plate from the core laminate such that the support plate is separated from one of the conductor layers on a first surface of the core laminate;
   forming a first interlayer resin insulating layer on the one of the conductor layers on the first surface of the core laminate;
   forming a plurality of via conductors through the first interlayer resin insulating layer;
   forming a second interlayer resin insulating layer on a second surface of the core laminate on an opposite side with respect to the first surface of the core laminate; and
   forming a plurality of via conductors formed through the second interlayer resin insulating layer,
   wherein the forming of the core laminate includes forming the plurality of conductor layers including a first conductor layer and a second conductor layer such that the first conductor layer is embedded in one of the insulating layers forming the first surface of the core laminate and has an exposed surface exposed from the insulating layer and that the second conductor layer is formed on one of the insulating layers forming the second surface of the core laminate, the first interlayer resin insulating layer and the second interlayer resin insulating layer are formed such that the thickness of the first interlayer resin insulating layer is greater than the thickness of the second interlayer resin insulating layer, and the plurality of via conductors in second interlayer resin insulating layer and the plurality of via conductors in the core laminate are formed such that the plurality of via conductors in the second interlayer resin insulating layer and the plurality of via conductors in the core laminate are tapering in an opposite direction with respect to a tapering direction of the plurality of via conductors in first interlayer resin insulating layer.

16. A method for manufacturing a printed wiring board according to claim 15, wherein the forming of the core laminate includes forming the first conductor layer on the support plate such that the first conductor layer has a pattern, forming on the first conductor layer the one of the insulating layers that forms the first surface of the core laminate and a metal foil such that the first conductor layer is embedded in the one of the insulating layers that forms the first surface of the core laminate, forming a plurality of via holes through the one of the insulating layers that forms the first surface of the core laminate and the metal foil such that the plurality of via holes is formed for forming a set of the via conductors on the first conductor layer, forming a seed layer on the metal foil such that the seed layer is formed in the via holes, forming a plating resist film such that the plating resist film has a pattern, applying electroplating on the seed layer on the metal foil and in the via holes exposed by the pattern of the plating resist film such that an electroplating film is formed on the seed layer on the metal foil and in the via holes exposed by the pattern of the plating resist film, removing the plating resist film from the seed layer, and removing the seed layer and the metal foil exposed by the removing of the plating resist film such that one of the conductor layers having a conductor pattern is formed for the core laminate.

17. A method for manufacturing a printed wiring board according to claim 16, further comprising:
   forming a conductor layer on the first interlayer resin insulating layer; and
   forming a conductor layer on the second interlayer resin insulating layer,
   wherein the forming of the conductor layer on the first interlayer resin insulating layer includes patterning the conductor layer on the first interlayer resin insulating layer such that the conductor layer on the first interlayer resin insulating layer includes a plurality of connection pads positioned to mount a semiconductor component on the conductor layer formed on the first interlayer resin insulating layer.

18. A method for manufacturing a printed wiring board according to claim 15, further comprising:
   forming a conductor layer on the first interlayer resin insulating layer; and
   forming a conductor layer on the second interlayer resin insulating layer,
   wherein the forming of the conductor layer on the first interlayer resin insulating layer includes patterning the conductor layer on the first interlayer resin insulating layer such that the conductor layer on the first interlayer resin insulating layer includes a plurality of connection pads positioned to mount a semiconductor component on the conductor layer formed on the first interlayer resin insulating layer.

19. A method for manufacturing a printed wiring board according to claim 15, wherein each of the insulating layers comprises a prepreg comprising resin material and inorganic fiber core material impregnated in the resin material.

20. A method for manufacturing a printed wiring board according to claim 15, wherein the first interlayer resin insulating layer comprises a prepreg comprising resin material and inorganic fiber core material impregnated in the resin material, and the second interlayer resin insulating layer comprises a prepreg comprising resin material and inorganic fiber core material impregnated in the resin material.

* * * * *